United States Patent [19]
Nilssen

[11] Patent Number: 5,471,118
[45] Date of Patent: Nov. 28, 1995

[54] ELECTRONIC BALLAST WITH POWER-FACTOR-CORRECTING PRE-CONVERTER

[76] Inventor: Ole K. Nilssen, Caesar Dr., Barrington, Ill. 60010

[21] Appl. No.: 304,690

[22] Filed: Sep. 12, 1994

Related U.S. Application Data

[63] Continuation-in-part of Ser. No. 20,696, Feb. 22, 1993, and Ser. No. 901,989, Jun. 22, 1992, which is a continuation-in-part of Ser. No. 856,392, Mar. 23, 1992, which is a continuation-in-part of Ser. No. 734,188, Jul. 22, 1991, which is a continuation-in-part of Ser. No. 646,497, Jan. 28, 1991, abandoned, which is a continuation of Ser. No. 107,795, Oct. 13, 1987, abandoned, which is a continuation-in-part of Ser. No. 658,423, Oct. 5, 1984, abandoned, which is a continuation-in-part of Ser. No. 555,426, Nov. 23, 1983, which is a continuation of Ser. No. 178,107, Aug. 14, 1980, abandoned, which is a continuation-in-part of Ser. No. 973,741, Dec. 28, 1978, abandoned, which is a continuation-in-part of Ser. No. 890,586, Mar. 20, 1978, Pat. No. 4,184,128, said Ser. No. 20,696 is a continuation-in-part of Ser. No. 840,528, Feb. 25, 1992, Pat. No. 5,189,342, which is a continuation of Ser. No. 646,497, which is a continuation of Ser. No. 107,795, which is a continuation-in-part of Ser. No. 658,423, which is a continuation-in-part of Ser. No. 555,426, which is a continuation of Ser. No. 178,107, which is a continuation-in-part of Ser. No. 973,741, which is a continuation-in-part of Ser. No. 890,586.

[51] Int. Cl.⁶ .................................................. H05B 37/00
[52] U.S. Cl. .................... 315/247; 315/307; 315/227 R; 315/243
[58] Field of Search ................................. 315/247, 209 R, 315/291, 307, 308, 227 R, 243

[56] References Cited

U.S. PATENT DOCUMENTS 4,277,728  7/1981  Stevens ......................... 315/307

Primary Examiner—Robert J. Pascal
Assistant Examiner—Reginald A. Ratliff

[57] ABSTRACT

In a power-line-operated current-fed parallel-tuned electronic ballast, power-factor-correction and harmonics-reduction are attained by placing a high-frequency inductor as well as a high-frequeny voltage source in series with the DC output of a bridge rectifier connected with the power line voltage. The DC output is then supplied to a filter capacitor through a high-speed diode, thereby to provide a DC voltage of substantially constant magnitude to the ballast's inverter while at the same time drawing power from the power line with a power factor well over 90% and with a total harmonics content well under 20%. The AC voltage provided from the high-frequency voltage source, which has a peak-to-peak magnitude essentially equal to that of the power line voltage, is represented by a simple auxiliary winding on the ballast's main output transformer. The inductance of the high-frequency inductor is determined by the frequency of the ballast's AC output voltage as well as by the amount of power drawn from the power line.

21 Claims, 13 Drawing Sheets (Pre-Converter Circuit)

(Bridge Inverter Circuit)

(Pre-Converter Circuit)

(Bridge Inverter Circuit)

ELECTRONIC BALLAST WITH POWER-FACTOR-CORRECTING PRE-CONVERTER

RELATED APPLICATIONS

Instant application is a Continuation-in-part of Ser. No. 08/020,696 filed Feb. 22, 1993; which is a Continuation-in-Part of Ser. No. 07/840,528 filed Feb. 25, 1992, now U.S. Pat. No. 5,189,342; which is a Continuation of Ser. No. 07/646,497 filed Jan. 28, 1991, now abandoned; which is a Continuation of Ser. No. 07/107,795 filed Oct. 13, 1987, now abandoned; which is a Continuation-in-Part of Ser. No. 06/658,423 filed Oct. 5, 1984, now abandoned; which is a Continuation-in-Part of Ser. No. 06/555,426 filed Nov. 23, 1983; which is a Continuation of Ser. No. 06/178,107 filed Aug. 14, 1980, now abandoned; which is a Continuation-in-Part of Ser. No. 05/973,741 filed Dec. 28, 1978, now abandoned; which is a Continuation-in-Part of Ser. No. 05/890,586 filed Mar. 20, 1978, now U.S. Pat. No. 4,184,128.

Instant application is also a Continuation-in-Part of Ser. No. 07/901,989 filed Jun. 22, 1992; which is a Continuation-in-Part of Ser. No. 07/856,392; which is a Continuation-in-Part of Ser. No. 07/734,188 filed Jul. 22, 1991; which is a Continuation-in-Part of Ser. No. 07/646,497 filed Jan. 28, 1991, now abandoned; which is a Continuation of Ser. No. 07/107,795 filed Oct. 13, 1987, now abandoned; which is a Continuation-in-Part of Ser. No. 06/658,423 filed Oct. 5, 1984, now abandoned; which is a Continuation-in-Part of Ser. No. 06/555,426 filed Nov. 23, 1983; which is a Continuation of Ser. No. 06/178,107 filed Aug. 14, 1980, now abandoned; which is a Continuation-in-Part of Ser. No. 05/973,741 filed Dec. 28, 1978, now abandoned; which is a Continuation-in-Part of Ser. No. 05/890,586 filed Mar. 20, 1978, now U.S. Pat. No. 4,184,128.

BACKGROUND OF THE INVENTION

FIELD OF THE INVENTION

Instant invention relates to a power-line-operated current-fed self-oscillating parallel-tuned resonant transistor inverter ballast, particularly of a kind that includes a special power-factor-correcting pre-converter means.

SUMMARY OF THE INVENTION

OBJECTS OF THE INVENTION

An object of the present invention is that of providing cost-effective electronic ballasts for gas discharge lamps.

This, as well as other objects and advantages of the present invention will become apparent from the following description.

BRIEF DESCRIPTION

In one of its presently preferred embodiments, the invention is represented by a full-bridge inverter having four field-effect-type switching transistors ("FET's"), with each FET being controlled by positive feedback of an alternating voltage obtained via a Zener diode from a winding on the tank-inductor of a resonant L-C circuit connected across the bridge inverter's output terminals. The bridge inverter is powered with a DC supply voltage obtained via a special pre-converter means connected with an ordinary electric utility power line by way of a bridge rectifier.

A substantially constant-magnitude DC supply voltage is provided to the bridge inverter by way of a special power-factor-correcting pre-converter means that includes the following principal elements: (i) a full-wave rectifier connected with the AC power line voltage and operative to provide a non-filtered DC voltage between a DC+ terminal and a DC– terminal; (ii) a high-frequency filtering capacitor connected between the DC– terminal and the DC+ terminal; (iii) a small high-frequency inductor, a high-frequency voltage source, and a high speed rectifier, all of which are series-connected between the DC+ terminal and a B+ bus; (iv) a B– bus connected directly with the DC– terminal; and (v) a DC filtering capacitor connected between the B– bus and the B+ bus.

The high-frequency voltage source need be nothing more than an auxiliary winding tightly coupled with the inverter's tank-inductor; which high-frequency voltage source is arranged to provide a high-frequency voltage of peak-to-peak magnitude about equal to that of the AC power line voltage.

The effect of adding the high-frequency voltage in series with the unfiltered DC voltage output of the full-wave rectifier is that of causing current to be drawn (or "pumped") from the power line all through the full cycle of the AC power line voltage, thereby substantially improving the power factor over what it would have been without the addition of the high-frequency "pumping" voltage.

The inductance of the high-frequency inductor is chosen such that the magnitude of the DC supply voltage established across the DC filtering capacitor (i.e., between the B– bus and the B+ bus) is about equal to (or just slightly higher than) the peak magnitude of the AC power line voltage. If, for a given load, the inductance is substantially lower than that, the magnitude of the DC supply voltage will substantially exceed the peak magnitude of the AC power line voltage.

With properly chosen magnitudes for the high-frequency "pumping" voltage and for the inductance of the high-frequency inductor, current will be drawn from the power line with a power factor well in excess of 90% and with total harmonic content substantially below 20%.

In a somewhat different implementation, the special power-factor-correcting pre-converter means includes the following principal elements: (i) a full-wave rectifier connected with the AC power line voltage and operative to provide a non-filtered DC voltage between a DC+ terminal and a DC– terminal; (ii) a high-frequency filtering capacitor connected between the DC– terminal and the DC+ terminal; (iii) a small high-frequency inductor with a tightly coupled auxiliary winding, and a high speed rectifier, all of which are series-connected between the DC+ terminal and a B+ bus; (iv) a B– bus connected directly with the DC– terminal; (v) a DC filtering capacitor connected between the B– bus and the B+ bus; and (vi) a means to feed the ballast's output current (e.g., the total lamp current) through the auxiliary winding on the high-frequency inductor.

Thus, the full-bridge inverter is powered with the constant-magnitude DC voltage provided between the B– bus and the B+ bus.

Each of the four FET's in the bridge inverter is driven by providing to its gate input an AC gate drive voltage derived from a positive feedback winding on the tank-inductor of the L-C circuit.

DESCRIPTION OF THE FIRST EMBODIMENT

Details of Construction of First Embodiment

Figure 1:
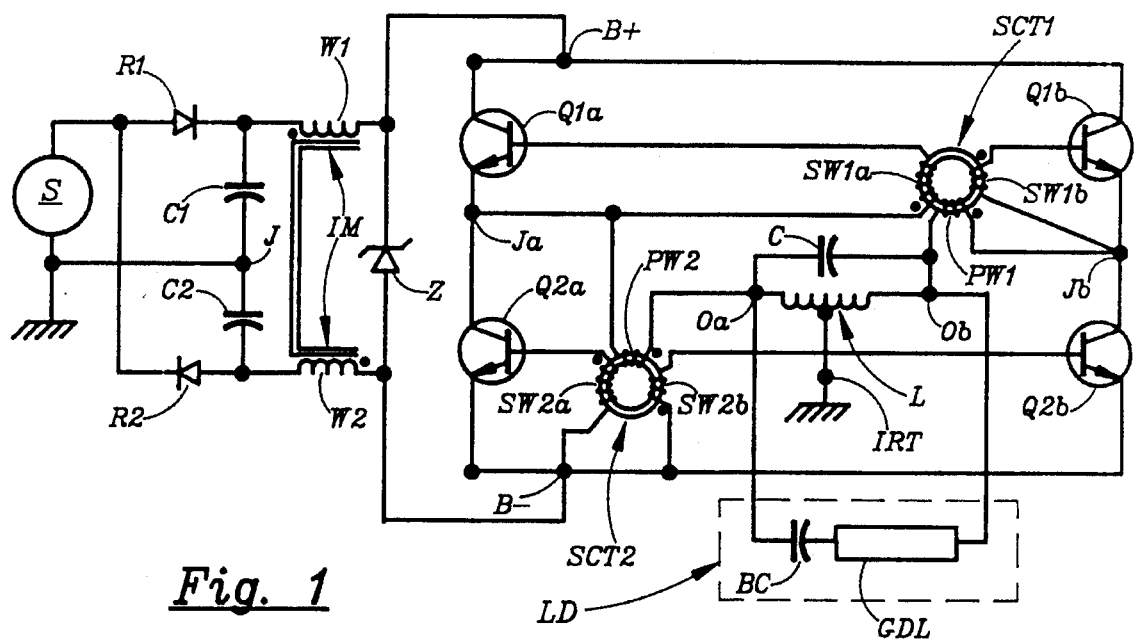
FIG. 1 schematically illustrates a first embodiment of and/or related to the preferred embodiment of the invention.

FIG. 1 shows an AC power supply S, which in reality is an ordinary 120 Volt/60 Hz electric utility power line.

One terminal of power supply S is grounded and also directly connected to a junction J between two energy-storing capacitors C1 and C2. The other terminal of power supply S is connected to the anode of a rectifier R1 and to the cathode of a rectifier R2. Rectifier R1 has its cathode connected to one terminal of C1—the other terminal of C1 being connected to junction J. Rectifier R2 has its anode connected to one terminal of C2—the other terminal of C2 being connected to junction J.

An inductor means IM has two equal but separate windings W1 and W2: W1 is connected between the cathode of rectifier R1 and a junction B+ between the collectors of two transistors Q1a and Q1b; W2 is connected between the anode of R2 and a junction B− between the emitters of two transistors Q2a and Q2b.

A Zener diode Z is connected between junction B+ and junction B−.

Transistor Q1a is connected with its emitter to a junction Ja, as is also the collector of transistor Q2a. Transistor Q1b is connected with its emitter to a junction Jb, as is also the collector of transistor Q2b.

A center-tapped inductor L is connected between inverter output terminals Oa and Ob. Connected in parallel with L is a capacitor C. The center-tap on inductor L, which is referred-to as inverter reference terminal IRT, is grounded.

Primary winding PW1 of saturable current-transformer SCT1 is connected between junction Jb and output terminal Ob. Primary winding PW2 of saturable current-transformer SCT2 is connected between junction Ja and output terminal Oa.

One secondary winding SW1a of transformer SCT1 is connected between the base and the emitter of transistor Q1a; another secondary winding SW1b of transformer SCT1 is connected between the base and the emitter of transistor Q1b.

One secondary winding SW2a of transformer SCT2 is connected between the base and the emitter of transistor Q2a; another secondary winding SW2b of transformer SCT2 is connected between the base and the emitter of transistor Q2b.

A series-combination of a ballasting capacitor CB and a gas discharge lamp GDL constitutes a load LD; which load is connected across output terminals Oa and Ob.

Details of Operation of First Embodiment

The operation of the full-bridge inverter circuit of FIG. 1 may be explained as follows.

Source S provides 120 Volt/60 Hz voltage to the voltage-doubling and rectifying/filtering circuit consisting of R1, R2, C1 and C2. A substantially constant DC voltage of about 320 Volt magnitude then results at the output of this circuit, with the positive side of this DC voltage being present at the cathode of R1 and the negative side being present at the anode of R2.

This substantially constant-magnitude DC voltage is applied by way of inductor means IM and its two windings W1 and W2, poled as indicated, to the DC power input terminals B+ and B− of the full-bridge inverter circuit comprising transistors Q1a, Q1b, Q2a and Q2b.

This inverter circuit is made to self-oscillate by way of positive current feedback provided by saturable current-transformers SCT1 and SCT2, poled as indicated. Thus, the magnitude of the current provided to any given transistor's base-emitter junction is proportional to the magnitude of the current flowing between output terminals Oa and Ob.

The frequency of inverter oscillation is determined by a combination of the saturation characteristics of the saturable current-transformers and the natural resonance frequency of the parallel L-C circuit (as combined with any tuning effects caused by the load connected thereacross).

The saturation characteristics of the saturable current-transformers are substantially identical to one another and so chosen that, when there is no load connected across output terminals Oa and Ob, the waveform of the output voltage is as indicated in FIG. 2a; which waveform is made up of sinusoidal half-waves of voltage, indicated by HW1 and HW2, interconnected with periods of zero-magnitude voltage, indicated by ZM1 and ZM2. This waveform is achieved by making the time-length of the saturation-time required for the saturable current-transformers to reach saturation longer than the time-length of one of the sinusoidal half-waves of voltage. The degree to which the time-length of the saturation-time is longer than the time-length of one of the sinusoidal half-waves of voltage corresponds to the time-length of the periods of zero-magnitude voltage.

In FIG. 2a, each of the sinusoidal half-waves of voltage represents the natural interaction between L and C as fed from a substantially constant current source.

In combination, the two separate but equal windings W1 and W2 of inductor means IM provide for a total inductance that is large enough so that the current flowing through the two windings and into the inverter remains substantially constant during a complete time-period of one cycle of the inverter's oscillation.

That is, the DC current flowing into the B+ junction and out of the B− junction is substantially constant during the interval between point X and point Y in FIG. 2a. Thus, whenever the L-C parallel circuit is connected between B+ and B−—which it is during the complete time-length of each of the sinusoidal half-waves of voltage—it is indeed fed from a substantially constant current source.

When a load impedance having a net component of capacitive reactance (such as does LD) is connected across the inverter's output terminals Oa and Ob, capacitive reactance is in effect added to the L-C parallel circuit; which results in the time-lengthening of the sinusoidal half-waves of voltage—as indicated by FIG. 2b. The more capacitance added this way, the more time-lengthening results.

On the other hand, when a load impedance having a net component of inductive reactance is connected between Oa and Ob, the result would be a time-shortening of the sinusoidal half-waves of voltage.

By having two different load impedances connected between Oa and Ob, and by having these two load impedances be of conjugate nature, there will be no net effect on the length of the period of the sinusoidal half-waves. For instance, by having another gas discharge lamp like GDL connected in series with an inductor having a reactance of the same absolute magnitude as that of CB, and by connecting this series-combination in parallel with load LD, the total net load impedance would be resistive and would cause no net shortening or lengthening of the sinusoidal half-waves of voltage.

By making the time-length of the saturation-time of the saturable current-transformers substantially equal to the time-length of one of the sinusoidal half-waves of voltage, the resulting output voltage will be as illustrated in FIG. 2c; which indicates that the net inversion frequency will now be the same as the natural resonance frequency of the L-C parallel circuit (as combined with whatever load impedance might be connected between Oa and Ob).

By making the time-length of the saturation-time of the saturable current-transformers shorter than the time-length of one of the sinusoidal half-waves of voltage, the resulting output voltage will be as illustrated in FIG. 2d; which indicates that the net inversion frequency will now be higher then the natural resonance frequency of the L-C circuit (as combined with whatever load impedance might be connected between Oa and Ob).

Additional Comments re First Embodiment (a) As long as the time-length of the saturation-time of the saturable current-transformers remains equal to or longer than the time-length of one of the sinusoidal half-waves of voltage, the net inversion frequency will not be affected by the addition or removal of a load impedance, such as LD of FIG. 1, regardless of the magnitude of the net reactive impedance thereby added to or subtracted from the L-C parallel circuit.

(b) The magnitude of the Zener voltage of Zener diode Z is chosen such as to be somewhat higher than the maximum magnitude of the peak voltage of the sinusoidal half-waves of voltage present across the inverter's output terminals Oa and Ob. That way, the Zener diode will not interfere with normal operation of the inverter; yet, it will prevent the magnitude of the peak voltages of the sinusoidal half-waves from substantially exceeding the normally occurring maximum magnitudes. Without the Zener diode, for various transient reasons (such as due to the sudden removal of a load) the magnitude of the peak voltages of the sinusoidal half-waves would occasionally become substantially larger than the normally occurring maximum magnitudes; and that would either cause transistor destruction, or it would necessitate the use of very special transistors of exceptionally high voltage capabilities.

(c) Inductor L is center-tapped; which, in effect, provides for a center-tap between the inverter's output terminals Oa and Ob. This center-tap is grounded. In many applications, particularly in the case of fluorescent lamp ballasts, it is very valuable to have the output referenced to ground.

(d) Inductor L may be integrally combined with a center-tapped auto-transformer; in which case the output voltage can readily be provided at any desired magnitude, while maintaining a ground-connected center-tap.

(e) Inductor means IM may consist of two entirely independent inductors—with one inductor located in each leg of the power supply. In fact, it is even acceptable under some circumstances to use but a single inductor in just one leg of the power supply; in which case, however, it would not be possible to connect the output's center-tap with the power supply's center-tap.

(f) It is not necessary to power the inverter of FIG. 1 from a voltage doubler. However, doing so provides for the advantage in many situations of being able to reference the center-tap of the inverter's output with one of the legs of the power line.

(g) The inverter of FIG. 1 must be triggered into oscillation. This triggering may be accomplished by way of providing a special trigger winding on each of the feedback current-transformers, and then to discharge a capacitor through these trigger windings. This may be done automatically with an arrangement consisting of a capacitor-resistor combination connected between B+ and B−, and a Diac for discharging the capacitor through the trigger windings.

(h) Finally, it is noted that the average absolute magnitude of the AC voltage appearing between inverter output terminals Oa and Ob must be substantially equal to the magnitude of the DC voltage provided from across the two series-connected energy-storing capacitors C1 and C2.

Or, stated differently, in the circuit of FIG. 1, if the inverter's AC output voltage as provided between terminals Oa and Ob were to be rectified in a full-wave rectifier, the average magnitude of the DC voltage obtained from this full-wave rectifier would have to be substantially equal to the magnitude of the DC voltage supplied from the DC output of the rectifier/filter combination consisting of R1, R2, C1 and C2.

This relationship would have to exist substantially regardless of the nature of the load connected between the inverter's output terminals.

(i) Although the full-bridge inverter circuit of FIG. 1 may be designed to invert at any one of a wide range of frequencies, in the preferred embodiment the inversion frequency is approximately 30 kHz. Thus, the time-length of the interval between point X and point Y of FIG. 2a is about 33 micro-seconds.

Figure 2:
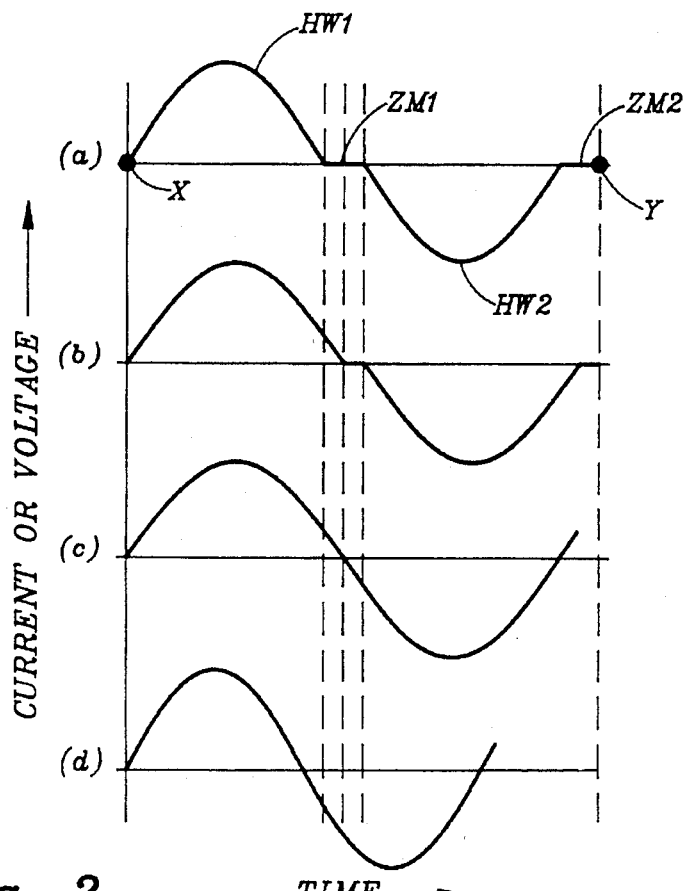
FIG. 2 shows various voltage waveforms associated with the first embodiment.

(j) The waveforms of FIG. 2 depict the voltage present between output terminals Oa and Ob under different operating conditions. Of course, the voltage present between Oa and inverter reference terminal IRT is equal to half the voltage present between terminals Oa and Ob.

(k) Due to the balanced nature of the inverter and its DC power supply, with reference to any one of the terminals of filter capacitors C1 and C2, any high frequency voltage present at inverter reference terminal IRT—even if it were not connected with ground—would have negligible magnitude.

(l) The primary windings of saturable current transformers SCT1 and SCT2 have fewer turns than do the secondary windings. Typically, the transistors operate with a 1:4 primary-to-secondary turns ratio; which corresponds to a forced current gain of four. At that turns ratio, the magnitude of the voltage developing across the primary winding of each of the saturable current transformers is only one fourth of the magnitude of the base-emitter voltage; which, of course, is only about 0.8 Volt.

In other words, the magnitude of the voltage developing across the primary winding of each staturable transformer is only about 0.2 Volt; which, of course, represents a magnitude that is totally negligible in comparisn with the magnitude of the voltage developing between output terminals Oa and Ob.

Thus, the voltage at terminal Ob is substantially equal to the voltage at terminal Jb; and the voltage at terminal Oa is substantially equal to the voltage at terminal Ja.

DESCRIPTION OF THE SECOND EMBODIMENT

Details of Construction of Second Embodiment

Figure 3:
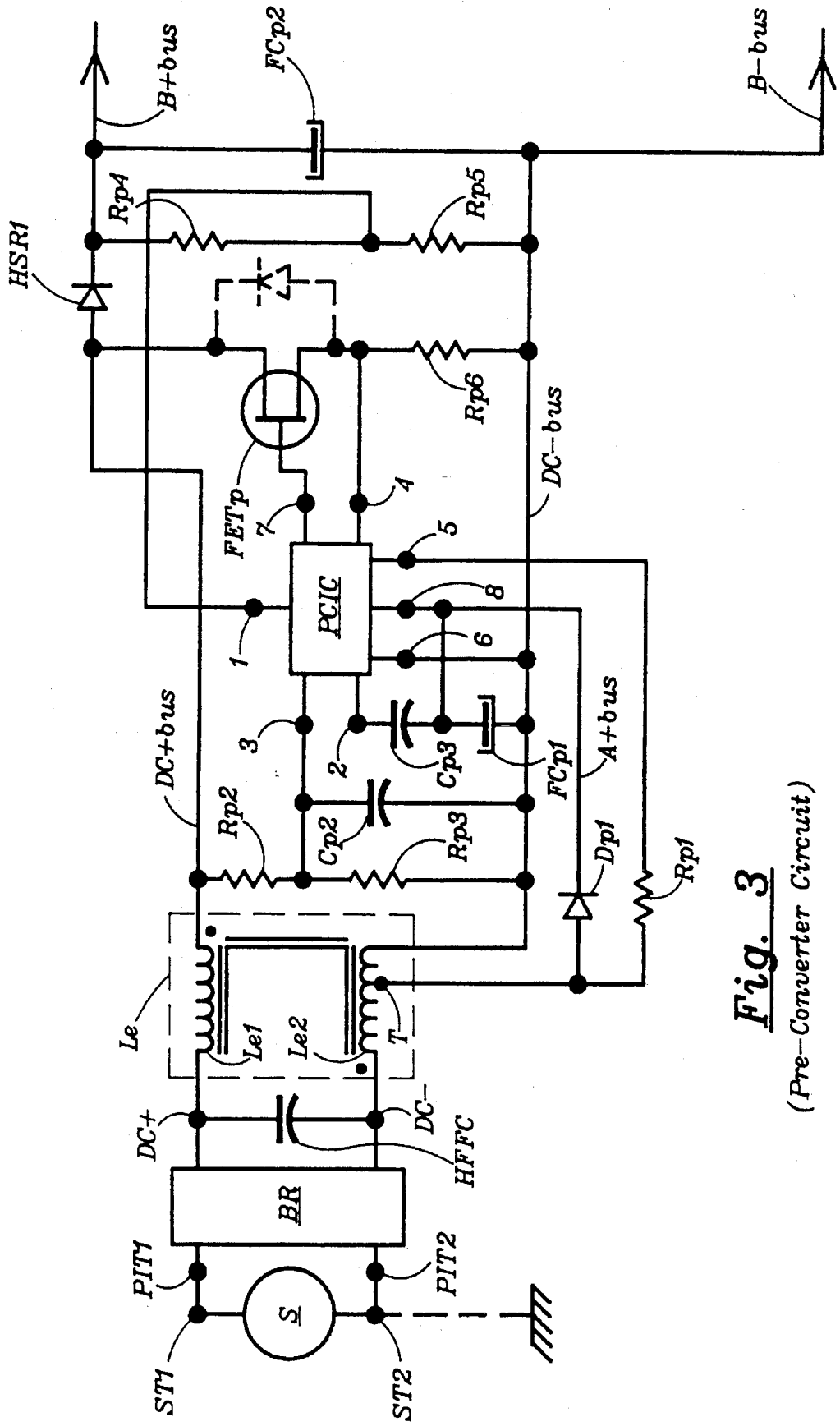
FIG. 3, Parts I & II, schematically illustrates a second embodiment of and/or related to the preferred embodiment of the invention.
Figure 3:
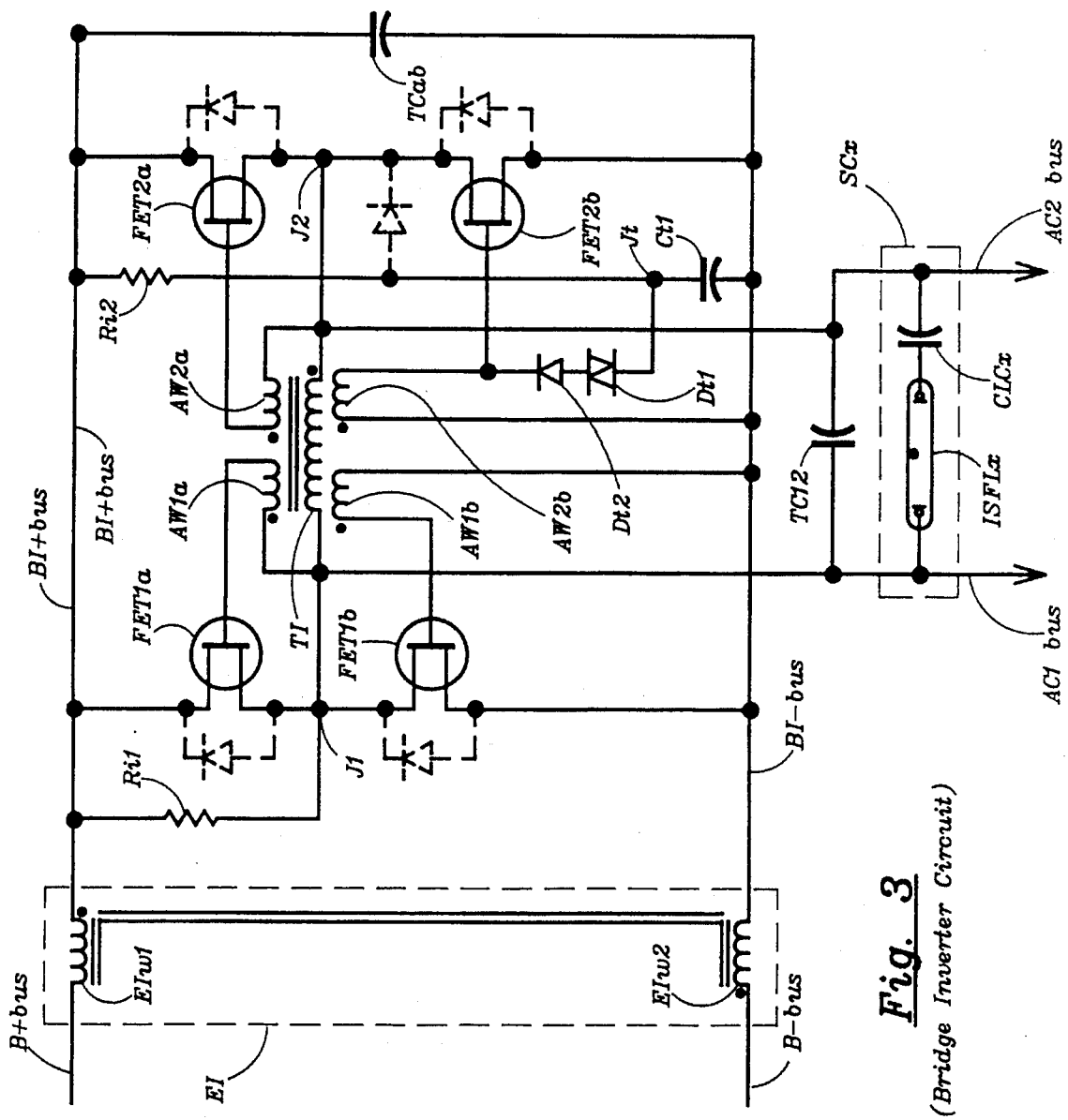

FIG. 3 is a schematic diagram of the second embodiment of the invention.

In FIG. 3, an ordinary electric utility power line is represented by a source S, whose source terminals ST1 and ST2 are connected with a pair of power input terminals PIT1 and PIT2 of a bridge rectifier BR; which bridge rectifier BR has two DC output terminals DC– and DC+. A high-frequency filtering capacitor HFFC is connected between the DC– terminal and the DC+ terminal.

A first winding Le1 of energy-storing inductor Le is connected between the DC+ terminal and a DC+ bus; which DC+ bus is connected with a B+ bus by way of a high-speed rectifier HSR1. A second winding Le2 of energy-storing inductor Le is connected between the DC– terminal and a DC– bus; which DC– bus is connected directly with a B– bus. 1B– bus. Windings Le1 and Le2 are two mutually coupled windings wound on a single magnetic structure.

A pre-converter PCIC is an integrated circuit (Motorola MC 34262) and has eight terminals 1–8. Terminal 8 is connected with an A+ bus; which A+ bus is also connected with the cathode of a diode Dp1, whose anode is connected with a tap T on winding Le2. A resistor Rp1 is connected between tap T and terminal 5 of PCIC. A filter capacitor FCp1 is connected between the A+ bus and the DC– bus; and a filter capacitor FCp2 is connected between the B– bus and the B+ bus.

A resistor Rn2 is connected between the DC+ bus and a terminal 3 of the PCIC; while a resistor Rn3 and a capacitor Cp2 are parallel-connected between terminal 3 and the DC– bus.

A capacitor Cp3 is connected between terminal 2 of the PCIC and the A+ bus; while terminal 6 is connected with the DC– bus. A resistor Rp4 is connected between the B+ bus and terminal 1; and a resistor Rp4 is connected between terminal 1 and the B– bus. Terminal 4 is connected with the DC– bus via a resistor Rp6.

A field effect transistor FETp is connected: (i) with its source terminal to terminal 4 of the PCIC, (ii) with its drain terminal to the DC+ bus, and (iii) with its gate terminal to terminal 7 of the PCIC.

The B+ bus is connected with a BI+ bus via a first winding EIw1 of an energy-storing inductor EI; while the B– bus is connected with a BI– bus via a second winding EIw2 of energy-storing inductor EI. Windings EIw1 and EIw2 are two mutually coupled windings on a single magnetic structure.

Each of field effect transistors FET1a and FET2a is connected with its drain terminal to the BI+ bus; and each of field effect transistors FET1b and FET2b is connected with its source terminal to the BI– bus. The source terminals of transistors FET1a and FET1b are connected with junctions J1 and J2, respectively; as are also the drain terminals of transistors FET1b and FET2b, as well as an AC1 bus and an AC2 bus, all respectively.

A tank inductor TI is connected between junction J1 and J2; which tank inductor has four auxiliary windings coupled thereto: AW1a, AW1b, AW2a, and AW2b; which windings are connected between the gate and source terminals of transistors FET1a, FET1b, FET2a, and FET2b, all respectively.

A first tank capacitor TCab is connected between the BI– bus and the BI+ bus; while a second tank capacitor TC12 is connected between junctions J1 and J2 (i.e., between the AC1 bus and the AC2 bus). A series-combination SC of a first current-limiting capacitor CLCx and a first instant-start fluorescent lamp ISFLx is connected between the AC1 bus and the AC2 bus.

A resistor Rt1 is connected between the BI+ bus and a junction Jt; a capacitor Ct1 is connected between junction Jt and the BI– bus; and a Diac Dt1 is connected between junction Jt and the anode of a diode Dt2, whose cathode is connected with the gate terminal of transistor FET2b.

Details of Operation of Second Embodiment

Figure 4:
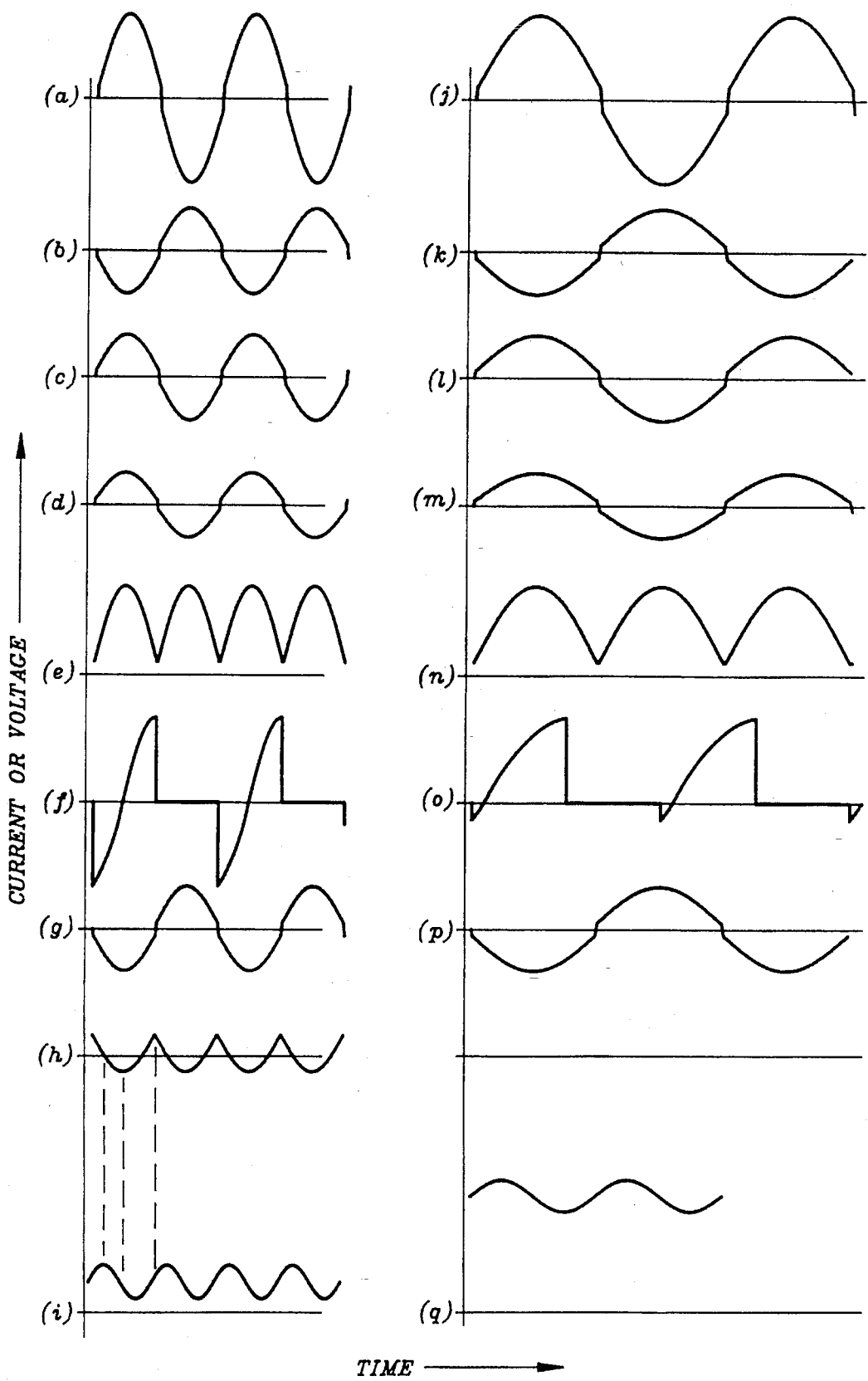
FIG. 4, Parts I & II, shows various voltage and current waveforms associated with the second embodiment.

The operation of the second embodiment of FIG. 3 may best be understood by making reference to the voltage and current waveforms of FIG. 4; wherein:

Waveform (a) represents the high-frequency voltage existing between the AC1 bus and the AC2 bus under a condition of no load (i.e., with fluorescent lamp ISFLx removed);

Waveform (b) represents the high-frequency voltage existing between Earth Ground and the AC1 bus under no-load condition;

Waveform (c) represents the high-frequency voltage existing between Earth Ground and the AC2 bus under no-load condition;

Waveform (d) represents the voltage existing between the BI– bus and the gate of transistor FET1b (i.e., the gate-source drive voltage of transistor FET1b) under no-load condition;

Waveform (e) represents the voltage existing between the BI– bus and the BI+ bus under no-load condition;

Waveform (f) represents the current flowing through transistor FET1b under no-load condition;

Waveform (g) represents the AC voltage existing between the B– bus (or the B+ bus) and junction J1 (or J2) under a condition of no load; which is to say: disregarding any DC voltage component, waveform (d) represents the actual voltage existing between the B– bus (or the B+ bus) and junction J1 (or J2) under no-load condition;

Waveform (h) represents the voltage existing between the B– bus and the BI– bus under no-load condition;

Waveform (i) represents the current flowing between the B– bus and the BI– bus (or: between the BI+ bus and the B+ bus) under no-load condition;

Waveform (j) represents the high-frequency voltage existing between the AC1 bus and the AC2 bus under a condition of part load (i.e., with fluorescent lamp ISFLx connected and functioning);

Waveform (k) represents the high-frequency voltage existing between Earth Ground and the AC1 bus under part-load condition;

Waveform (l) represents the high-frequency voltage existing between Earth Ground and the AC2 bus under part-load condition;

Waveform (m) represents the voltage existing between the BI– bus and the gate of transistor FET1b (i.e., the gate-source drive voltage of transistor FET1b) under part-load condition;

Waveform (n) represents the voltage existing between the BI' bus and the BI+ bus under part-load condition Waveform (o) represents the current flowing through transistor FET1b under part-load condition;

Waveform (p) represents the AC voltage existing between the B– bus (or the B+ bus) and junction J1 (or J2) under part-load condition; which is to say: disregarding any DC voltage component, waveform (p) represents the actual voltage existing between the B– bus (or the B+ bus) and junction J1 (or J2) under part-load condition;

Waveform (q) represents the current flowing between the B– bus and the BI– bus (or: between the BI+ bus and the B+ bus) under part-load condition;

Waveform (r) represents the full-wave-rectified power line voltage existing between the DC– terminal and the DC+ terminal under part-load condition;

Waveform (s) represents the voltage existing between the DC+ terminal and the DC+ bus under part-load condition;

Waveform (t) represents the voltage existing between the DC– terminal and the DC– bus under part-load condition;

With reference to the waveforms of FIG. 4, the operation of the embodiment of FIG. 3 may now be described as follows.

As illustrated by waveform (r), full-wave rectification of the AC power line voltage from source S results in a pulsating (i.e., unfiltered) unidirectional voltage existing between the DC– terminal and the DC+ terminal. This unfiltered unidirectional voltage is supplied to a pre-converter circuit; which, except for using a split winding on its energy-storing inductor L, functions in a substantially ordinary manner, thereby to provide a filtered and regulated DC supply voltage between the B– bus and the B+ bus. {The complete assembly between the power line input terminals (PIT1, PIT2) and the DC supply voltage output terminals (i.e., the B– bus and the B+ bus) is referred-to as the Pre-Converter Circuit.}

The fact that energy-storing inductor L has two windings provides for two auxiliary benefits.

One auxiliary benefit is that of causing less electromagnetic interference (EMI) to be conducted from the Pre-Converter Circuit to the power line conductors; which benefit results for the reason that—just like any ordinary two-winding EMI choke—the split-winding energy-storing inductor L provides both common-mode and differential-mode attenuation of the EMI signals (unintentionally) generated in the Pre-Converter Circuit (and/or in the Bridge Inverter Circuit).

The other auxiliary benefit is that of maintaining symmetry of voltages and currents with respect to each of the power line supply terminals (ST1, ST2) (as well as with respect to earth ground); which symmetry facilitates the provision of a balanced AC output voltage from the AC output terminals of the Bridge Inverter Circuit (i.e., the AC1 bus and the AC2 bus).

As a consequence of the split-winding feature, the voltage existing between the DC+ terminal and the DC+ bus will be as shown by waveform (s), and the voltage existing between the DC– terminal and the DC– bus will be as shown by waveform (t). The sum of these two voltages would be equal to the voltage that would exist across the winding of an ordinary single-winding energy-storing inductor as used in an ordinary pre-converter circuit.

The filtered and regulated DC supply voltage from the Pre-Converter Circuit (which exists between the B– bus and the B+ bus) is provided to the Bridge Inverter Circuit, where it is applied between the BI+ bus and the BI– bus by way of windings EIw2 and EIw2, respectively.

Windings EIw1 and EIw2 are wound on a single magnetic structure (e.g., ferrite core) in a mutually coupled manner. Thus, they constitute a single energy-storing inductive entity; and, except for voltage and current symmetry considerations, the two windings could just as well have been combined into a single winding.

With the DC supply voltage applied between the BI– bus and the BI+ bus, the Bridge Inverter Circuit is triggered into self-oscillation, with the triggering being effected by elements Ri1, Ri2, Ct1, Dt1 and Dt2.

After triggering, the basic bridge inverter per se (i.e., the circuit assembly consisting of principal elements FET1$a$, FET1$b$, FET2$a$, FET2$b$, and TI) will self-oscillate by way of the positive feedback provided via the auxiliary windings on tank-inductor TI (i.e., auxiliary windings AW1$a$, AW1$b$, AW2$a$ and AW2$b$).

Although the average magnitude of the DC voltage present between the BI– bus and the BI+ bus must be equal to that of the DC supply voltage (as provided between the B– bus and the B+ bus), the instantaneous magnitude of this DC voltage will vary in synchronism with the oscillations of the bridge inverter.

The effect of tank-capacitors TCa and TC12 is that of making the waveform of the alternating voltage provided between the bridge inverter's output terminals (i.e., J1 and J2) sinusoidal, with the frequency of oscillation being determined by the resonant interaction between these tank-capacitors and tank-inductor TI.

With the fluorescent lamp (ISFLx) non-connected (i.e., when supplying no output power), some of the voltage and current waveforms associated with the self-oscillating Bridge Inverter Circuit are as shown by waveforms (a) through (i) of FIG. 4.

In particular, it is noted that the high-frequency voltage existing between Earth Ground and the AC1 bus is equal in magnitude but opposite in phase as compared with the high-frequency voltage existing between Earth Ground and the AC2 bus.

Also, it is noted that the alternating voltage existing between the B– bus and junction J1 is equal to the high-frequency voltage existing between Earth Ground and the AC1 bus. Of course, the alternating voltage existing between the B+ bus and junction J1 is substantially identical to the alternating voltage existing between the B– bus and junction J1.

Since the voltage existing between the AC1 bus and the AC2 bus is sinusoidal {see waveforms (a) and (j)}, and since this sinusoidal voltage is the same as that existing across tank-inductor TI, the waveform of each of the gate-source drive voltages provided from auxiliary windings AW1$a$, AW1$b$, AW2$a$ and AW2$b$ will also be sinusoidal {see waveforms (d) and (m)}.

While it is unusual in a power-handling inverter to operate FET's with a sinusoidal gate-source drive voltage (as opposed to the usual squarewave gate-source drive voltage), such may indeed be done without incurring excessive power losses while at the same time averting damage to the FET's.

To minimize switching power losses, it is necessary that the peak magnitude of the sinusoidal gate-source drive voltage be significantly higher than the magnitude merely required to cause the FET to fully enter its ON-state; which means that the peak magnitude of a sinusoidal gate-source drive voltage must be significantly higher than the peak magnitude of a squarewave gate-source drive voltage (which is what is conventionally used for driving FET's in a power-handling inverter). In particular, in the Bridge Inverter Circuit of FIG. 3, the peak magnitude of the sinusoidal drive voltage provided to the gate-source inputs of each of the FET's is about 40 Volt; which is higher by a factor of four at compared with the peak magnitude required when a squarewave gate-source drive voltage is used.

While a peak voltage of 40 Volt is higher than the peak gate-source voltage normally considered permissible for power FET's, is indeed acceptable (i.e., without incurring damaging effects) with certain types of FET's, such as FET's of type IRF 721 from International Rectifier Corporation, El Segundo, Calif. With a sinusoidal drive voltage of 40 Volt peak magnitude, total power dissipation in the FET's in the Bridge Inverter Circuit was indeed acceptably low.

With the fluorescent lamp (ISFLx) connected (i.e., when supplying a moderate amount of output power), some of the voltage and current waveforms associated with the self-oscillating Bridge Inverter Circuit of FIG. 3 are as shown by waveforms (j) through (q) of FIG. 4.

It is noted that the frequency of the all the waveforms associated with the partially loaded condition is substantially lower than that of the no-load condition. This is so for the reason that, when the lamp is connected and operating, the voltage across it is very small (only about 150 Volt RMS) compared with the magnitude of the voltage present across the lamp-capacitor series-combination (about 500 Volt RMS); which means that this series-combination constitutes substantial additional capacitive loading on the inverter's basic tank-circuit (i.e., tank-inductor TI as combined with tank-capacitors TCa and TC12), thereby reducing the natural resonance frequency.

Additional Comments re Second Embodiment (aa) In some situations, to provide for affirmative triggering of the Bridge Inverter Circuit of FIG. 3, a resistor may be connected between the BI+ bus and junction J1.

(ab) In most situations, tank-capacitor TC12 may safely be eliminated; in which case tank-capacitor TCa should be increased in capacitance sufficiently to compensate for any undesirable increase in (no-load) oscillating frequency due to the removal of TC12.

(ac) As is the case with any ordinary electric utility power line, the power line conductors are electrically connected with earth ground, either directly or by way of a low-resistance path. In case of the circuit arrangement of FIG. 3, this connection is indicated by one of the power line conductors having electrical connection with Earth Ground.

(ad) With reference to waveform (a) of FIG. 4, as well as with reference to waveform (d), it is noted that the waveform of the inverter output voltage under no-load condition is sinusoidal except for a small portion of the total wave cycle. More particularly, during a very brief period at or near each cross-over point of the voltage wave, instead of having the usual slope associated with a sinusoidal wave, the wave has a notably steeper slope.

This slope-steepening is due to the fact that, during this very brief period, none of the four transistors is fully in its ON-state; which means that tank-capacitor TCa is, during this very brief period, at least partly disconnected from tank-inductor TI; which, in turn, causes the voltage across tank-conductor TI to rise at a higher rate; which higher rate is now limited by tank-capacitor TC12 only, as opposed to being limited by both tank-capacitors TC12 and TCa.

Of course, the slope-steepening effect on the waveform of the inverter's output voltage is directly reflected in the waveform of the gate-source drive voltage of each FET.

As indicated by waveforms (j) and (m), the slope-steepening effect is less pronounced under loaded conditions.

(ae) Since the fluorescent lamp (ISFLx) is ballasted by way of a capacitor, the slope-steepening effect referred-to in section (ad) above has the effect of causing an added spike or pulse in the instantaneous magnitude of the current provided to the fluorescent lamp; which spike or pulse occurs at or near each absolute-magnitude-peak of the otherwise substantially sinusoidal lamp current.

(af) With reference to FIG. 3, it should be understood that additional lamp-capacitor series-combinations may be connected between the AC1 bus and the AC2 bus (i.e., across the AC rails). However, the more such series-combinations so connected, the lower will be the frequency of oscillation of the inverter and thus the lower will be the frequency of the AC voltage provided between the AC1 bus and the AC2 bus; which correspondingly results in a lower magnitude of the current delivered through the series capacitors (i.e., the ballasting capacitors) to each lamp.

(ag) It is emphasized that waveforms (b), (c), (k) and (l) of FIG. 4 represent the waveforms of the high-frequency componets of the actual voltages existing between Earth Ground and the AC1/AC2 buses under no-load and part-load condittions. However, it is important to realize that the waveforms of these actual voltages also include low-frequency components; which low-frequency components are not shown in the waveforms of FIG. 4.

In situations where the presence of such low-frequency components are found to be of concern with respect to passing the U.L. shock-hazard safety requirements (e.g., the so-called U.L Pin Test), it is noted that a high-pass filter (e.g., in the form a low-frequency blocking capacitor in series-connection with each of the AC1/AC2 buses) will mitigate such shock-hazard possibilites.

DESCRIPTION OF A THIRD EMBODIMENT

Details of Construction of Third Embodiment

Figure 5:
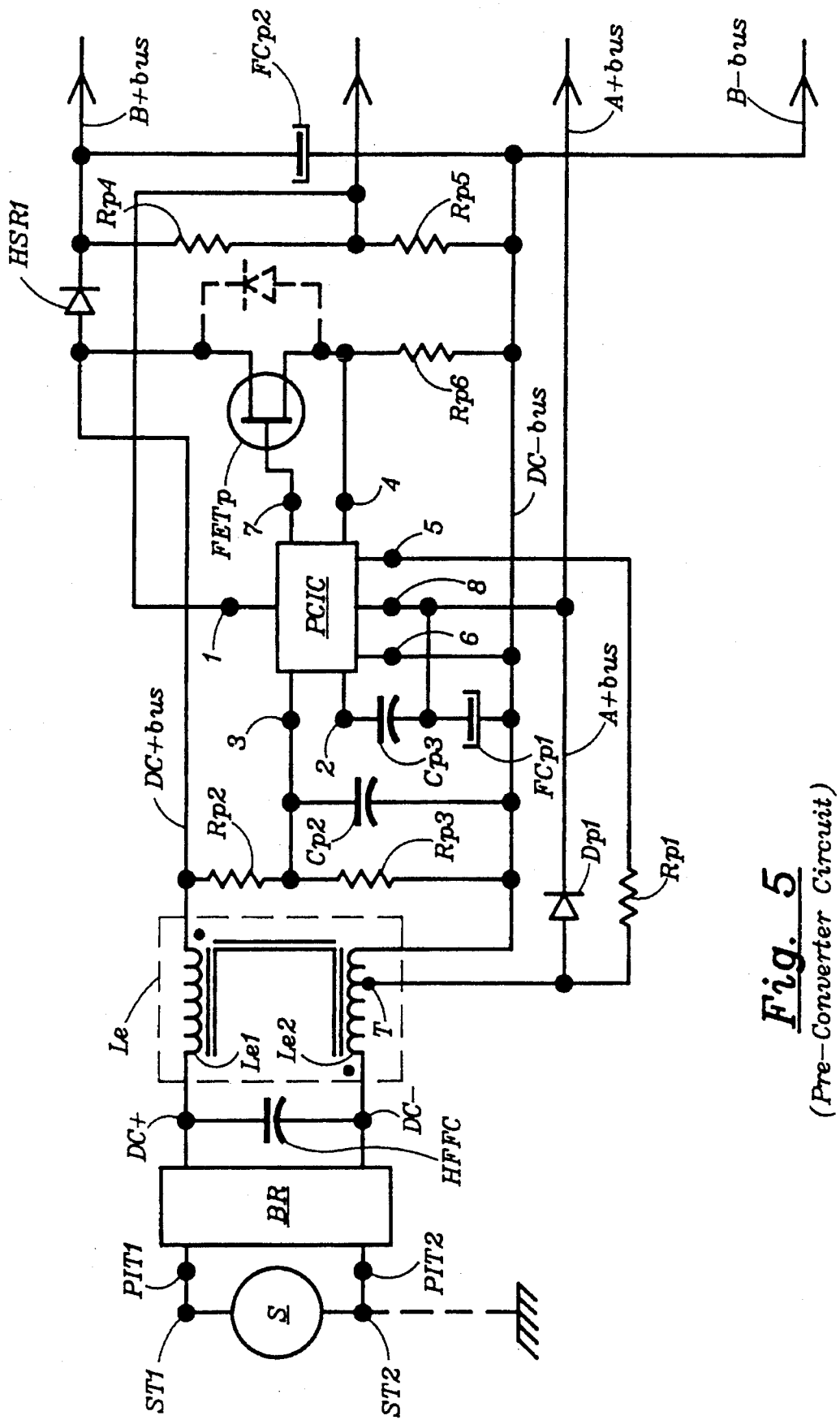
FIG. 5, Parts I & II, schematically illustrates a third embodiment of and/or related to the preferred embodiment of the invention.
Figure 5:
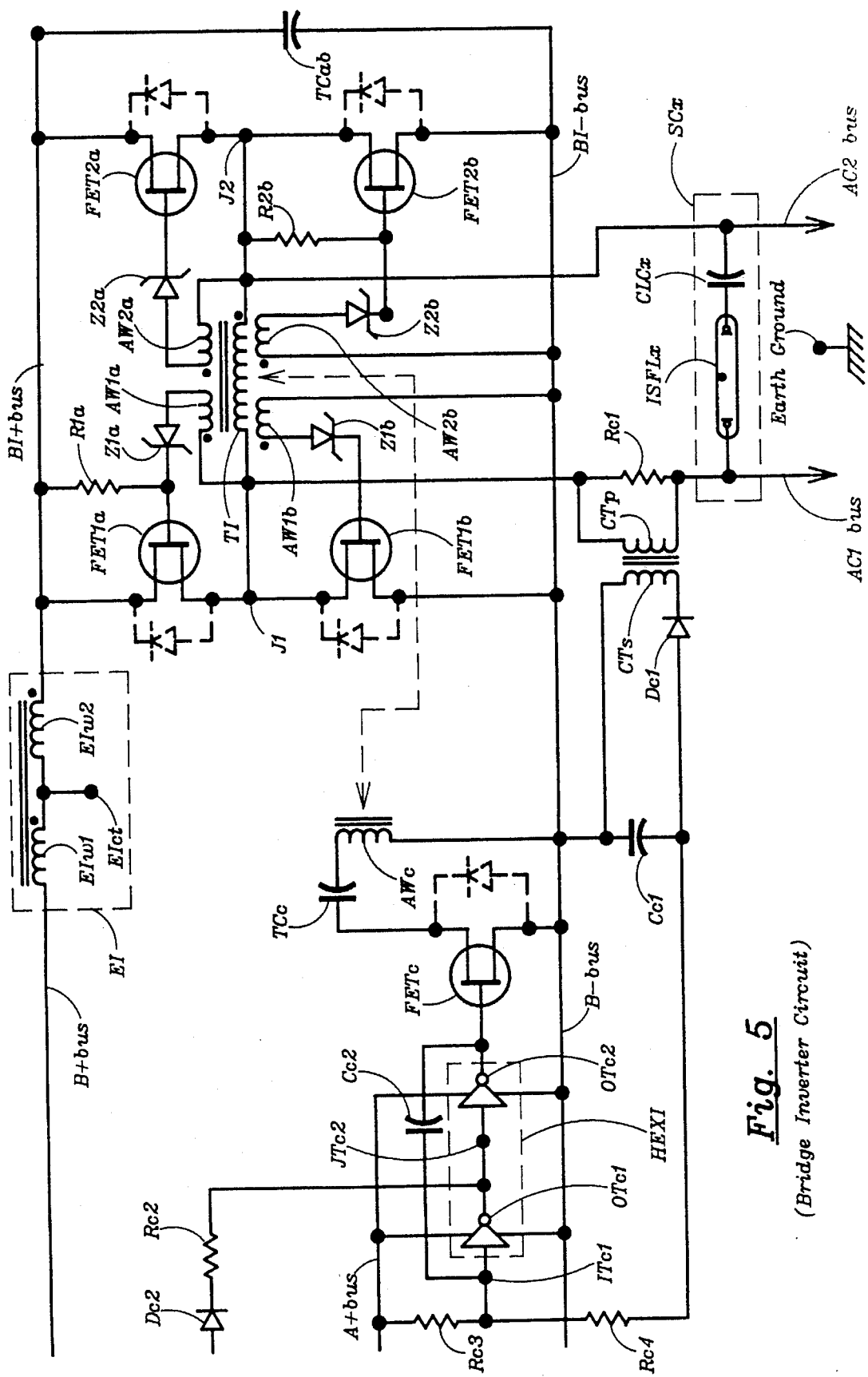

FIG. 5 is a schematic diagram of a third preferred embodiment of the present invention.

The arrangement of FIG. 5 is identical to that of FIG. 3 except for the following modifications.

Tank capacitor TC12 has been removed.

Elements Ri1, Ri2, Ct1, Dt1 and Dt2 have been removed.

A resistor R1a is connected between the drain terminal and the gate terminal of transistor FET1a; a resistor R2b is connected between the drain terminal and the gate terminal of transistor FET2b.

Zener diodes Z1a, Z1b, Z2a, Z2b are interposed between windings AW1a, AW1b, AW2a, AW2b and the gate terminals of transistors FET1a, FET1b, FET2a, FET2b, all respectively and in each case with the cathode of the Zener diode being connected with its associated gate terminal.

Winding EIw2 of inductor EI has been relocated such as to be connected directly in series with winding EIw1, thereby having both these windings series-connected between the B+ bus and the BI+ bus, thereby also leaving the B− bus connected directly with the BI− bus. The mid-point of the series-combined windings EIw1 and EIw2 is identified as center-tap EIct.

A resistor Rc1 has been inserted in series with the AC1 bus in such manner that whatever current flows from the AC1 bus must flow through resistor Rc1. Parallel-connected with resistor Rc1 is the primary winding CTp of a control transformer CT, whose secondary winding CTs is connected between the B− bus and the cathode of a diode Dc1, whose anode is connected with the B− bus by way of a capacitor Cc1.

An auxiliary winding AWc on tank inductor TI is connected with one of its terminals to the B− bus; the other one of its terminals being connected with the drain terminal of a field effect transistor FETc through a tank-capacitor TCc.

The source terminal of transistor FETc is connected with the B− bus; and the gate terminal of transistor FETc is connected with output terminal OTc2 of inverter Ic2 of a HEX Inverter HEXI. Input terminal ITc2 of inverter Ic2 is connected with output terminal OTc1 of inverter Ic1 of HEX inverter HEXI. Input terminal ITc1 of inverter Ic1 is connected with output terminal OTc2 of inverter Ic2 by way of a feedback capacitor Cc2.

A resistor Rc2 is connected between output terminal OTc1 and the cathode of a diode Dc2; a resistor Rc3 is connected between the A+ bus and input terminal ITc1 of inverter Ic1; while a resistor Rc4 is connected between input terminal ITc1 of inverter Ic1 and the anode of diode Dc1.

Details of Operation of Third Embodiment

Figure 6:
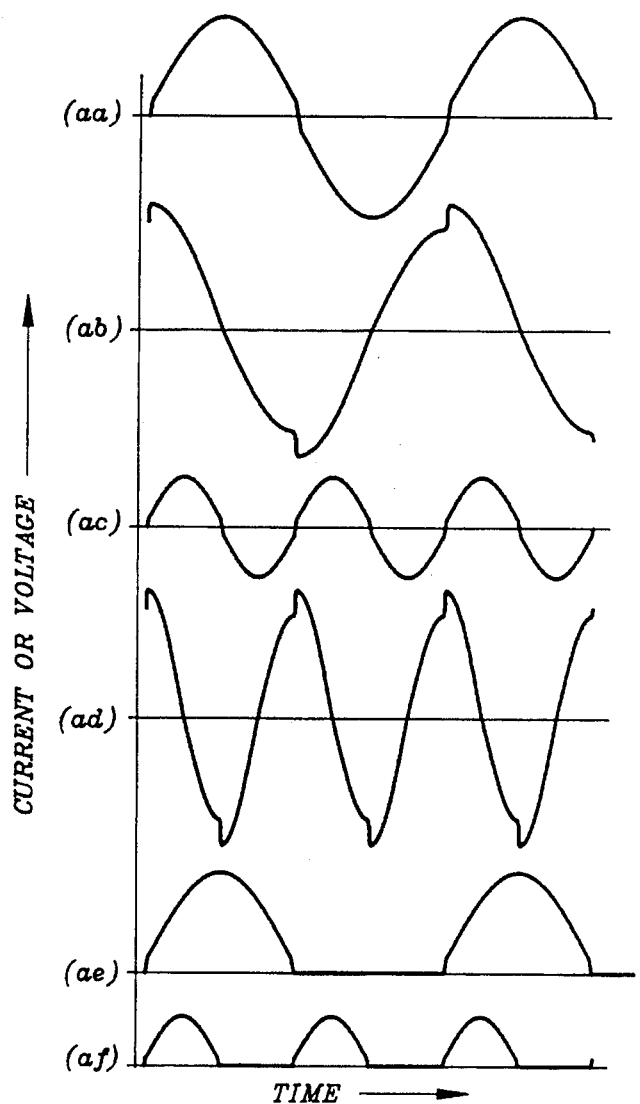
FIG. 6 shows various voltage and current waveforms associated with the third embodiment.
Figure 4:
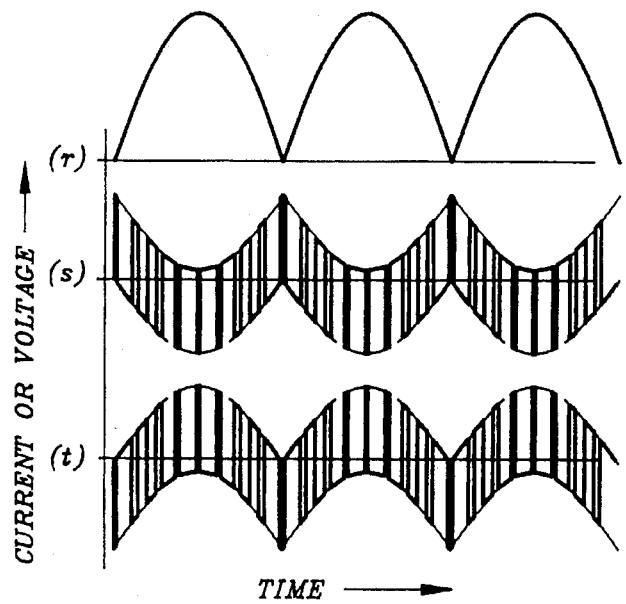

The operation of the third preferred embodiment of FIG. 5—to the extent that it differs from the operation of the preferred embodiment of FIG. 3—may best be understood by making reference to the voltage and/or current waveforms of FIG. 6; wherein:

Waveform (aa) represents the high-frequency voltage existing between the AC1 bus and the AC2 bus under a condition of less-than-full load (i.e., with fewer than all intended lamp-capacitor series-combinations—one of which would be SCx—connected between the AC1/AC2 buses).

Waveform (ab) represents the high-frequency current flowing through lamp ISFLx under the condition of less-than-full load.

Waveform (ac) represents the high-frequency voltage existing between the AC1 bus and the AC2 bus under a condition of full load (i.e., with all intended lamp-capacitor series-combinations connected between the AC1/AC2 buses).

Waveform (ad) represents the high-frequency current flowing through lamp ISFLx under the condition of full load.

Waveform (ae) represents the voltage present between the BI− bus and the drain terminal of transistor FET1$b$ under a condition of less-than-full load.

Waveform (af) represents the voltage present between the BI− bus and the drain terminal of transistor FET1$b$ under a condition of full load.

Now, with reference to the waveforms of FIGS. 4 and 6, the operation of the embodiment of FIG. 5 may be described as follows.

The Zener voltage of each of the Zener diodes (Z1$a$, Z1$b$, Z2$a$, Z2$b$) has been chosen such as to be slightly higher in magnitude than that of the gate voltage at which each of the transistors (FET1$a$, FET1$b$, FET2$a$, FET2$b$) starts conducting current between its source and drain. As a result, each transistor switches OFF a brief period later than it would have switched OFF without the Zener diodes; which, as compared with the arrangement of FIG. 3, leads to a reduction in the duration of the short period of time during which none of the transistors conduct.

As a bottom-line result—comparing exemplary waveform (a) of FIG. 4 with exemplary waveform (aa) of FIG. 6—the degree of slope-steepening at the cross-over points of the inverter's otherwise sinusoidal output voltage has been minimized; which, in turn, leads to a lamp current with better crest-factor as compared with the lamp current crest-factor associated with the arrangement of FIG. 3.

Also as a result of the Zener diodes, the bridge inverter can be biased (e.g., with resistors R1$a$ and R2$b$) so as to cause two of the transistors to conduct, thereby to cause the inverter to self-start and thereby to eliminate the need for the Diac-type trigger circuit of FIG. 3.

Now, with particular reference to FIG. 5 (the part showing the Bridge Inverter Circuit) and waveforms (aa) & (ab) versus waveforms (ac) & (ad) of FIG. 6, prior to the fluorescent lamps having ignited, transistor FETc exists in its ON-state; which is to say that it exists in its fully conductive state. This is so because no current flows through resistor Rc1; which means that no negative voltage is present at the anode of diode Dc1; which means that input terminal ITc1 of inverter Ic1 will (via resistor Rc3) be pulled to a potential sufficiently positive to cause the two series-connected inverters IC1 and IC2 (via regenerative action resulting from the positive feedback supplied via capacitor Cc2) to enter a state whereby output terminal OTc2 goes positive all the way to the level of the A+ bus, thereby causing transistor FETc to enter its ON-state. Thereafter, until the lamps ignite, input terminal ITc1 remains positive to a degree sufficient to maintain output terminal OTc2 positive.

With transistor FETc in its ON-state, tank capacitor TCc is in effect connected in parallel with tank-capacitors TCa and TC12, thereby causing the natural oscillating frequency of the bridge inverter to be lower by a substantial factor compared with what it would be with transistor FETc in its OFF-state.

As soon as the lamps ignite, current will flow through resistor Rc1; which will give rise to a negative voltage developing at the anode of diode Dc1; which, if that negative voltage be of sufficient magnitude, will cause the magnitude of the voltage present at input terminal ITc1 to decrease in magnitude sufficiently to cause the two series-connected inverters IC1 and IC2 (again via regenerative action) to cause the magnitude of the voltage at output terminal OTc2 to fall to a level sufficiently low to render transistor FETc non-conductive.

In fact, when all lamps are connected and in operation, the magnitude of the negative voltage developed at the anode of diode Dc1 is just sufficient to cause the two series-connected inverters (Ic1, IC2) to regenerate, thereby to cause transistor FETc to enter its OFF-state, thereby to remove tank-capacitor TCc from the tank-inductor, thereby to cause the frequency of the inverter's AC output voltage (i.e., the AC voltage provided between the AC1 bus and the AC2 bus) to increase substantially; which, if the magnitude of this AC output voltage were to have remained the same, would have cuased the magnitude of the lamp current to increase in proportion to the increase in frequency.

However, by action of diode Dc2 and resistor Rc2, the magnitude of the DC supply voltage will decrease simultaneously with the increase in frequency of the inverter's AC output voltage. This is so because output terminal OTc1 assumes a potential obverse to that of output terminal OTc2; which means that: (i) whenever transistor FETc is in its ON-state, output terminal OTc1 is at a potential close to that of the B− bus; which means that resistor Rc2 is in effect parallel-connected with resistor Rp5; which therefore causes the magnitude of the DC supply voltage to be regulated to a level substantially higher than the level to which it would be regulated without resistor Rc2 being so parallel-connected; and (ii) whenever transistor FETc is in its OFF-state, output terminal OTc1 is at a potential close to that of the A+ bus; which means that resistor Rc2 is now not parallel-connected with resistor Rp5; which means that the magnitude of the DC supply voltage be regulated at a level substantially lower than the level to which it be regulated when transistor FETc is in its ON-state.

Thus, as illustrated by the waveforms of FIG. 6: (i) whenever less than full load current is being drawn from the AC1 bus, the AC output voltage (i.e., the AC voltage provided between the AC1 bus and the AC2 bus) will have a relatively high RMS magnitude and a relatively low frequency; and (ii) whenever full load current is being drawn from the AC1 bus, the AC output voltage will have a relatively low RMS magnitude and a relatively high frequency.

Thus, if one or more lamps were to be removed during normal operation—such as would occur during an ordinary re-lamping procedure—the AC output voltage would increase in RMS magnitude but would decrease in frequency, thereby keeping the remaining lamp(s) properly powered. Yet, upon replacing all lamps (thereby re-establishing full load), the AC voltage would decrease in RMS magnitude while at the same time increasing in frequency.

An important reason for reducing the RMS magnitude of the AC output voltage when the ballast is operating at full power level is that of efficiency. For given sizes and/or ratings of components, the pre-converter (as well as the inverter) operates at higher efficiency when the magnitude of the DC supply voltage is lower. More particularly, the efficiency of the pre-converter increases with a reduction in the ratio between the absolute magnitude of the DC supply voltage and the peak absolute magnitude of the AC power line voltage.

For instance, with a given set of component parts, delivering 60 Watt of DC power at a DC rail voltage of about 350 Volt requires about 1.0 Watt more from a 120 Volt/60 Hz power line than delivering the same amount of DC power at a DC rail voltage of only 230 Volt.

Additional Comments re Third Embodiment (aa) The reason associated with removing tank-capacitor TC12 from the embodiment of FIG. 5 relates to two things:

1. The removal of tank-capacitor TC12 (even if the capacitance of tank-capacitor TCa were to be increased to provide for compensation in oscillating frequency) simply represents an economic advantage; and
2. The removal of tank-capacitor TC12 permits easier triggering of the inverter, thereby (in cases where the inverter circuit is provided with its DC supply voltage from a more-or-less ordinary pre-converter, such as is indeed the case in the embodiment of FIG. 5) permitting the removal of the trigger circuit consisting of elements Rt1, Ct1, Dt1 and Dt2 in exchange for a simpler trigger means connected in circuit between the pre-converter circuit and the gate-source terminals of transistor FET1$b$ (or transistor FET2$b$), thereby taking advantage of the start of oscillations of transistor FETp to trigger the inverter circuit into self-oscillation.

For instance, triggering of the inverter circuit could be accomplished by way of an auxiliary winding on energy-storing inductor Le; which auxiliary winding would be coupled between the gate-source terminals of transistor FET1$b$ by way of a resistor.

(ab) The frequency of operation of the inverter circuit of FIG. 3 is about 22 kHz when fully loaded. Yet, improved efficiency and/or reduced inductor sizes would result if it were possible to operate at higher frequencies when fully loaded. However, due to certain optical and/or electrical interference problems associated with certain commonly used in-building electronic control and communications systems (including particularly TV remote controls), it is important not to have electronic ballasts operate in the frequency range between 34 and 40 kHz (hereinafter the "forbidden frequency band").

In the embodiment of FIG. 5, due to the removal of tank-capacitor TC12, the frequency of operation of the inverter circuit is well in excess of 40 kHz when unloaded or partly loaded; yet, at about 32 kHz, it is safely under 34 kHz when fully loaded.

With a loaded operating frequency of 32 kHz, energy-storing inductor EI and tank-inductor TI can be substantially smaller and lighter-of-weight as compared with what would otherwise be required to attain a given efficiency level. Or, conversely, at given sizes and weights for the inductor elements, the operating efficiency would be substantially improved.

More particularly, the embodiment of FIG. 5 is characterized by operating above the forbidden frequency band during no-load and/or part-load conditions, while operating below the forbidden frequency band during fully loaded conditions.

In this connection, it is observed that presently available electronic ballasts of the so-called parallel-resonant type operate at frequencies of about 22 kHz when fully loaded.

(ac) It should be understood than many of the advantages associated with the full-bridge inverter circuit embodiments of FIGS. 3 and 5 may be attained as well with half-bridge and/or so-called parallel push-pull embodiments.

(ad) In ordinary electronic ballasts of the half-bridge parallel-resonant type—such as sold by Electronic Ballast Technology (EBT), Inc. of Torrance, Calif.—the peak magnitude of the voltage existing across each of the two inverter transistors is higher than (or at least as high as) half of the magnitude of the inverter's DC supply voltage multiplied by pi (i.e., 3.14). Thus, with a DC supply voltage of (say) 200 Volt, the peak magnitude of the voltage across one of the inverter transistors would usually be higher than (but would be at least as high as) 314 Volt.

In electronic ballasts of the push-pull parallel-resonant type—such as sold by Triad-Utrad (a unit of MagneTek, Inc. of Los Angeles, Calif.)—the peak magnitude of the voltage existing across each of the two inverter transistors is normally higher than (but is at least as high as) the magnitude of the inverter's DC supply voltage multiplied by pi (i.e., 3.14). Thus, with a DC supply voltage of (say) 200 Volt, the peak magnitude of the voltage across one of the inverter transistors would be at least 628 Volt.

In an electronic ballast built in accordance with the circuit arrangement of FIG. 1 herein, and as long as operating with the waveforms marked (a), (b) or (c) of FIG. 2 herein, the peak magnitude of the voltage across each one of the four inverter transistors will be higher than (or at least as high as) half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 1—when operating with waveforms (a)–(c)—would be at least 314 Volt.

In an electronic ballast built in accordance with the circuit arrangement of FIG. 1 herein, and as long as operating with the waveform marked (d) of FIG. 2 herein, the peak magnitude of the voltage across each one of the four inverter transistors will be lower than half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 1—when operating with waveform (d)—would be less than 314 Volt.

In an electronic ballast built in accordance with the circuit arrangement of FIGS. 3 or 5 herein, the peak magnitude of the voltage across each one of the four inverter transistors will be lower than half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 3 (or FIG. 5) would be less than 314 Volt.

In an electronic ballast built in accordance with the principles of the circuit arrangements of FIGS. 3 or 5 herein—even if using a half-bridge configuration instead of the illustrated full-bridge configuration—the peak magnitude of the voltage across each one of the two half-bridge inverter transistors would be lower than half of the magnitude of the inverter's DC supply voltage multiplied by pi (i.e., 3.14). Thus, with a DC supply voltage of (say) 200 Volt, the peak magnitude of the voltage across one of the two half-bridge inverter transistors would then be less than 314 Volt.

In an electronic ballast built in accordance with the principles of the circuit arrangements of FIGS. 3 or 5 herein— even if using a push-pull configuration instead of the illustrated full-bridge configuration—the peak magnitude of the voltage across each one of the two push-pull inverter transistors would be lower than the magnitude of the inverter's DC supply voltage multiplied by pi (i.e., 3.14). Thus, with a DC supply voltage of (say) 200 Volt, the peak magnitude of the voltage across one of the two push-pull inverter transistors would then be less than 628 Volt.

(ae) The reason why—for a given circuit topography and a given magnitude of DC supply voltage—the peak magnitude of the voltage existing across each transistor in the inverters of ordinary parallel-resonant-type electronic ballasts is higher than the peak magnitude of the voltage existing across each transistor in the inverter of an electronic ballast based on the parallel-resonant principles of the embodiments of FIGS. 3 and 5 herein is a result of the following basic difference: in the inverters of ordinary parallel-resonant electronic ballasts, no provision has been provided whereby—at least for a very brief period—none of the inverter's switching transistors is permitted to exists in its switched-ON or conductive state.

That is, in ordinary parallel-resonant electronic ballasts, usual practice is for one transistor to be switched OFF only after its obverse transistor has been switched ON {thereby having a situation where—for a brief period each half-cycle—both of two obverse (i.e., alternatingly switched) transistors are ON at the same time}; whereas, in the inverter circuit of FIGS. 3 and 5, provisions are made whereby one of the transistor is indeed switched OFF a short period before its obverse transistor has been switched ON, thereby providing for a situation where—at least for a very brief period of time—not one of a pair of obverse transistors (e.g., FET1*b* and FET2*a*) exists in a state of being switched ON.

(af) With reference to FIGS. 3 and 5, in some cases it may be non-feasible to provide between inverter output terminals J1 and J2 an AC voltage of the exact RMS magnitude required to exist between the AC1 bus and the AC2 bus for proper lamp ignition and operation. In such cases, an auto-transformer approach may be used to increase or decrease the RMS magnitude of the AC voltage provided between the AC1/AC2 buses. That is, tank-inductor TI may be integrally combined with an auto-transformer without having to add a separate transformer means.

(ag) In the bridge inverter circuits of FIGS. 3 and 5, the drive voltage provided between the gate-source terminals of each of transistors FET1*a*, FET1*b*, FET2*a* and FET2*b*—see waveform (d) of FIG. 4—is of substantially sinusoidal waveform and of a peak magnitude substantially higher than what's just required to cause each transistor to enter its fully conductive state.

Typically, the magnitude of the gate-source voltage required for causing a field effect transistor (such as FET1*a*, FET1*b*, FET2*a* and FET2*b*) to enter is full-conduction state (i.e., its full-ON state) is no higher than about 10 Volt; which means that if a squarewave-shaped drive voltage had been used for driving these FET's, its peak magnitude would not have had to be higher than about 10 Volt. However, since the FET's in the bridge inverter circuit arrangements of FIGS. 3 and 5 are provided with a substantially sinusoidally-shaped drive voltage, it is clear that the peak magnitude of this drive voltage has to be higher than 10 Volt.

In different implementations of the circuits of FIG. 3, sinusoidally-shaped base-source drive voltages of peak magnitudes from as low as 20 Volt to as high as 40 Volt have been successfully used. Except for possible long term detrimental consequences with respect to FET operating life, the higher peak magnitudes are preferable because of correspondingly (though not proportionally) better switching efficiency and correspondingly (though not proportionally) lower lamp current crest factor.

With respect to the arrangement of FIG. 3, and with further reference to waveform (ab) of FIG. 6, the magnitude of the bumps or pulses present at or near the peaks of each wave-crest of the lamp current diminishes with increased magnitude of gate-source drive voltage, thereby correspondingly resulting in an improved (i.e., reduced) lamp current crest factor.

Also with reference to FIG. 3 and waveform (ab) of FIG. 6, another way of reducing the magnitude of the bumps or pulses present at or near the peaks of each wave-crest of the lamp current—thereby to improve the crest-factor (though not necessarily the switching efficiency)—is that of placing a resistor in series with the input to each gate of each FET.

(ah) To facilitate triggering of the bridge inverter of FIG. 3, a resistor Ri1 is connected between the BI+ bus and junction J1.

(ai) With reference to FIG. 3, to stop continued triggering action after the inverter has attained self-sustaining oscillation, the anode of a diode may be connected with junction Jt and the cathode of the same diode may be connected with the drain terminal of transistor FET2*b*.

(aj) With reference to FIG. 5, so as to cause only a small drop in the magnitude of the current flowing through resistor Rc1 to cause transistor FETc to enter its switched-ON state, conventional hysteresis prevention measures may be used.

(ak) With reference to FIG. 5, the Zener diodes (Z1*a*, Z1*b*, Z2*a*, Z2*b*) provide for an effect quite similar to that of placing a resistor in series with each gate of each FET {as discussed in section (ag) above}; which is to say that they provide for a reduction in the cross-over distortion associated with waveform (a) of FIG. 4, reducing it to a level such as indicated by waveform (aa) of FIG. 6.

(al) In FIG. 5, to permit more leeway in the specifications required of the FET's and the Zener diodes, it is advantageous to bias each of transistors FET1*a* and FET2*b*, not only with a single resistor from gate to drain, but also with a resistor from gate to source; which is to say: biasing each of those two transistors by way of a voltage divider.

(am) To protect against electric shock hazard, which otherwise might result due to low-frequency power line voltage being present between Earth Ground and either the AC1 bus and/or the AC2 bus, a low-frequency blocking capacitor may be interposed in series with each of the AC1 bus and the AC2 bus.

(an) The ballasting arrangements of FIGS. 3 and 5 may effectivewly be used for Rapid-Start ("R.S.") fluorescent lamps as well; in which case low-voltage cathode heating power would be provided by way of auxiliary windings on tank-inductor TI.

To meet the so-called U.L. Pin Test without resorting to using an output (or power line) isolation transformer or an active Ground-Fault ("G.F.") prevention means, R.S. fluorescent lamps may be parallel-powered from the AC output rails (i.e., from the AC1/AC2 buses)—with each R.S. lamp being series-connected with a ballast capacitor to form an R.S. Lamp-Capacitor series-combination, and with each such series-combination being connected directly between the AC buses. Then, as long as the RMS magnitude of the AC output voltage (i.e., the AC voltage provided between the AC buses) is not much higher than what is required for proper rapid-starting of a single R.S. fluorescent lamp, shock-hazard-safe operation will result even in the absence of power line isolation transformer or G.F. prevention means.

(ao) Although tank-capacitor TCab is not connected directly in parallel across tank-inductor TI, it nevertheless functions as a parallel-connected tank-capacitor, thereby making the Bridge Inverter Circuit of FIG. 3 (and that of FIG. 5 as well) a parallel-resonant inverter or ballast circuit. This is so for the reason that—by way of the alternatingly switched bridge transistors—tank-capacitor TCab is commutated in such manner as to interact with the tank-inductor as if it were parallel-connected therewith.

(ap) In the Bridge Inverter Circuit of FIGS. 3 and 5, the exact value of the inductance of inductor EI is not highly critical to the efficient operation of the inverter. Yet, the higher the value of this inductance, the lower the amount of high-frequency ripple current that has to be handled by filter capacitor FCp2.

With reference to waveform (q) of FIG. 4, under a partly loaded condition, the current flowing through the windings of inductor EI is of a relatively high unidirectional magnitude with but a modest amount of high-frequency ripple.

(aq) With reference to the Bridge Inverter Circuits of FIGS. 3 and 5, instead of connecting each auxiliary winding on tank-inductor TI (e.g., AW1$b$) directly across the gate-source terminals of transistor FET1$b$, it may in some cases (such as when necessary to limit the peak magnitude of the voltage provided across the gate-source terminals) be preferable to connect the auxiliary winding thereacross by way of a resistor, while at the same time connecting a pair of series-connected back-to-back Zener diodes across the gate-source terminals. That way, even when supplied by a sinusoidal voltage from the auxiliary winding, the drive voltage presented to the gate-source terminals will be closer to a squarewave.

(ar) With reference to FIGS. 3 and 5, it is emphasized that series-combination SCx is merely representative of a plurality of such series-combinations which may all be parallel-connected with each other between the AC1 bus and the AC2 bus (i.e., across the AC rails).

(as) With reference to FIG. 5, in situations where Rapid-Start fluorescent lamps are to be powered from the Bridge Inverter Circuit, cathode heating voltage may advantageously be obtained by way of a small transformer having its primary winding connected in parallel with tank-capacitor TCc, and each of its secondary windings connected with a cathode. That way, cathode heating power would be provided only until all lamps had ignited. Thereafter, as soon as tank-capacitor TCc is switched out by way of transistor FETc, cathode power would cease to be provided, thereby providing for a situation of extra high ballast efficacy factor.

(at) With referene to FIG. 5, in situations where control of light output is desired, the ON/OFF control of transistor FETc can be effectuated by way of an external control means istead of by the automatic action shown.

Thus, for instance, resistor Rc4 may be removed; and control of HEXI—and thereby transistor FETc—may be effectuated by an external battery and switch.

Or, the gate terminal of FETc may be removed from HEXI's terminal OTc2 and connected instead to an external battery by way of a switch.

Alternatively, additional tank-capacitors may be switched in/out by way of additional transistors—with each additional tank-capacitor being switched in/out by its own transistor; and with each tank-capacitor/transistor combination being parallel-connected across winding AWc.

Thus, by switching in/out additional tank-capacitors, the amount of power delivered to the gas discharge lamps powered by the Parallel-resonant-type electronic ballast of FIG. 5 may be controlled over a relatively wide range; something which is not possible to accomplish with ordinary parallel-resonant-type electronic ballasts.

Also, the amount of powered delivered to the gas discharge lamps may be controlled to an additional degree by controlling the magnitude of the DC supply voltage; which can be effectuated by controlling the magnitude of the resistance placed in parallel with resistor Rp5.

In this connection it is important to note that only gas discharge lamps with externally heated cathodes (e.g., Rapid-Start fluorescent lamps) are suitable for wide-range control of lamp power.

(au) With reference to section (at) above, it is noted that in situations where electrical isolation from the power line is desired, external lamp power control can be effectuated with one or more tank-capacitors being switched in/out across a separate auxiliary winding (e.g., a winding labeled AWi) on tank-inductor TI.

(av) With respect to current flowing through an ordinary transistor, forward current is defined as the current flowing between the source terminal and the drain terminal in case of a field-effect transistor, or between the emitter terminal and the collector terminal in a bi-polar transistor, without flowing through any built-in commutating diode or diode-junction. Thus, whereas the magnitude of any reverse current which might flow through a transistor (e.g., through a built-in commutating diode) can not be controlled by way of the transistor's control terminals, the magnitude of the forward current can be controlled by application of a controllable voltage (in case of FET's) or current (in case of bi-polar transistors) to the transistor's control input terminals (i.e., the gate-source terminals of a FET or the base-emitter terminals of a bi-polar transistor).

(aw) The term "substantially sinusoidal waveform" is to be understood to apply to a waveform where, with respect to a purely sinusoidal waveform, the total harmonic distortion is no higher than 20%.

This definition notwithstanding, the total harmonic distortion of the various substantially sinusoidal waveforms associated with the inverter circuits of FIGS. 3 and 5 {e.g., waveforms (a) through (d), (g), (i), (j) through (m), (p), (q), (aa) and (ac) of FIGS. 4 and 6} is actually only about 10% or less.

(ax) In the inverter circuits of FIGS. 3 and 5, and as indicated by waveform (ae) and (af), a periodically pulsed unidirectional voltage exists across each field-effect transistor (e.g. FET1$a$); with each individual voltage pulse being equal to a complete half-cycle of a substantially sinusoidal voltage; with each such half-cycle being defined as having its beginning and its end at a cross-over point; with a cross-over point being defined as a point at which the instantaneous magnitude of the substantially sinusoidal voltage reverses polarity.

(ay) Even though not expressly so indicated, the fluorescent lamps of FIGS. 3 and 5 are disconnectable.

(az) With reference to waveforms (ad) and (ac) of FIG. 6, the current flowing through fluoresent lamp ISFLx (i.e., the lamp current) has a waveform which is composed of two principal components: (i) a substantially sinusoidal wave component of relatively large magnitude; and (ii) a square-wave component of relatively small magnitude.

The squarewave component is characterized as having cross-over points (i.e., phasing) displaced by about one quarter period (i.e., by about 90 degrees) from the cross-over points of the sinusoidal wave component.

The peak-to-peak magnitude of the squarewave component is equal to the height of the voltage-step occurring at the crest of the lamp current waveform.

(ba) Inductor EI (i.e., the inverter's feed inductor) may be located in series with either conductor connecting the bridge inverter to the source of DC supply voltage. However, to minimize EMI, as well as to minimize electric shock hazard associated with the inverter's output terminals (i.e., the AC1.AC2 buses), the feed inductor should be split, as indicated in FIG. 3.

(bb) In ordinary parallel-resonant-type electronic ballasts, the peak magnitude of the voltage existing across each transistor in the ballast's inverter is larger than pi times half of the magnitude of the DC voltage supplying the inverter, where pi is equal to 3.14.

In fact, in a parallel-resonant-type electronic ballast of the kind presently available in the U.S. market, such peak magnitudes were measured to exceed 3.4 times the magnitude of the DC supply voltage.

(bc) With reference to FIG. 5, it is noted that the complete inverter circuit used for converting the DC supply voltage (i.e., the DC voltage provided between the B− bus and the B+ bus) to the the substantially sinusoidal AC output voltage (i.e., the voltage provided between junctions J1 and J2) consists of only 13 individual components, namely: EI, TI, TCab, FET1a, FET1b, FET2a, FET2b, Z1a, Z1b, Z2a, Z2b, R1a and R2b.

DESCRIPTION OF A FOURTH EMBODIMENT

Details of Construction of Fourth Embodiment

Figure 7:
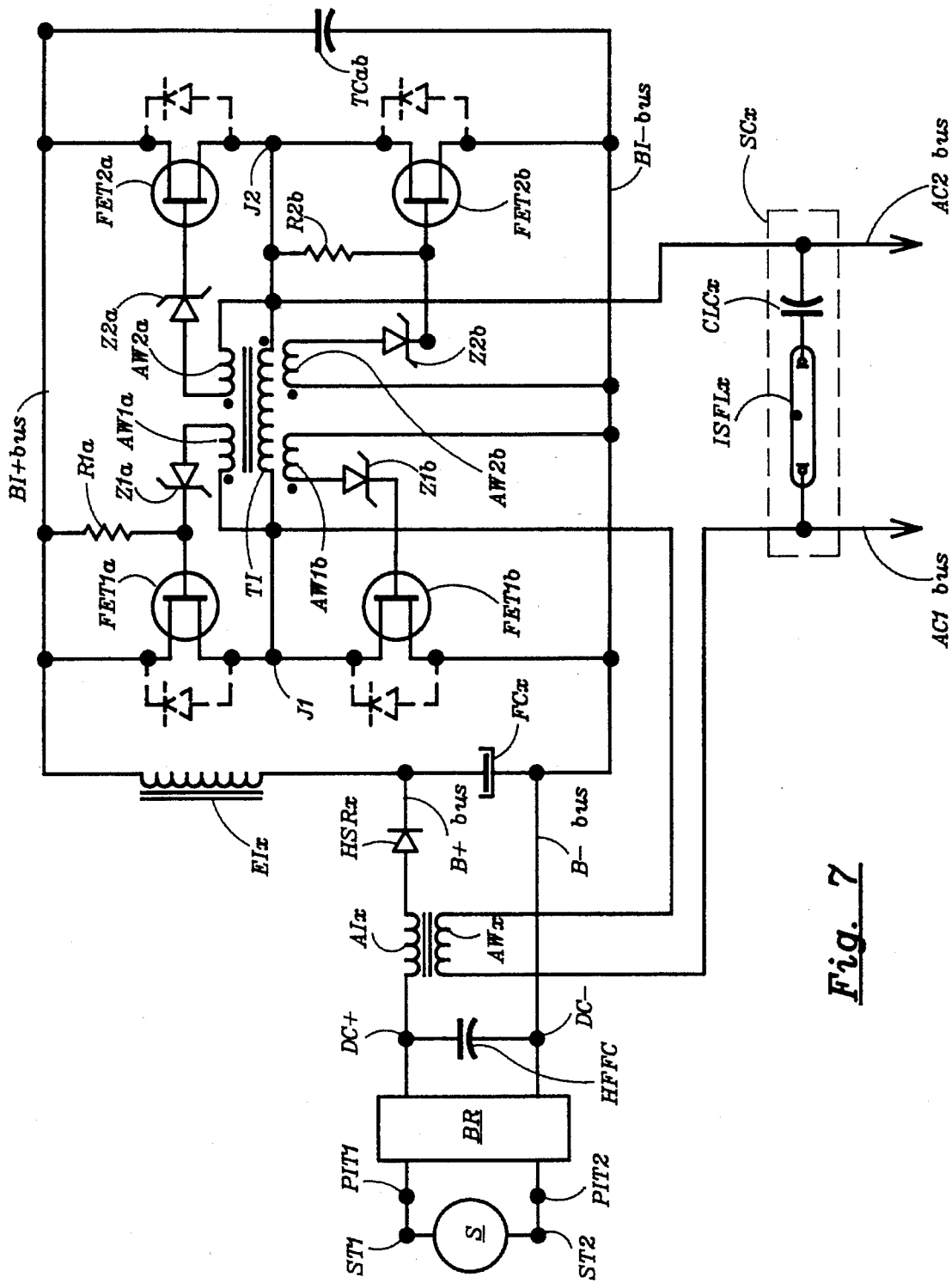
FIG. 7 schematically illustrates a first version of a fourth embodiment; which fourth embodiment represents the presently preferred embodiment of the invention.

FIG. 7 is a schematic diagram of a first version of fourth and preferred embodiment of the present invention.

In FIG. 7, power line source S, power input terminals PIT1 & PIT2, bridge rectifier BR, high-frequency filtering capacitor HFFC, and terminals DC− & DC+ directly correspond to those of the arrangement of FIG. 5. Also, with the exception that auxiliary winding AWc on tank inductor TI has been removed and replaced with an auxiliary winding AWx (which is tightly coupled with an auxiliary inductor AIx) that is interposed between junction J1 and the AC1 bus, all the elements connected between the BI− bus and the BI+ bus correspond directly to those similarly connected in the arrangement of FIG. 5.

Otherwise, in the arrangement of FIG. 7, auxiliary inductor AIx is connected between the DC+ terminal and the anode of a high speed rectifier HSRx, whose cathode is connected with a B+ bus. An energy-storing inductor EIx is connected between the B+ bus and the BI+ bus. A filter capacitor FCx is connected between the B+ bus and a B− bus; which B− bus is directly connected with the BI− bus as well as with the DC− terminal.

Figure 9:
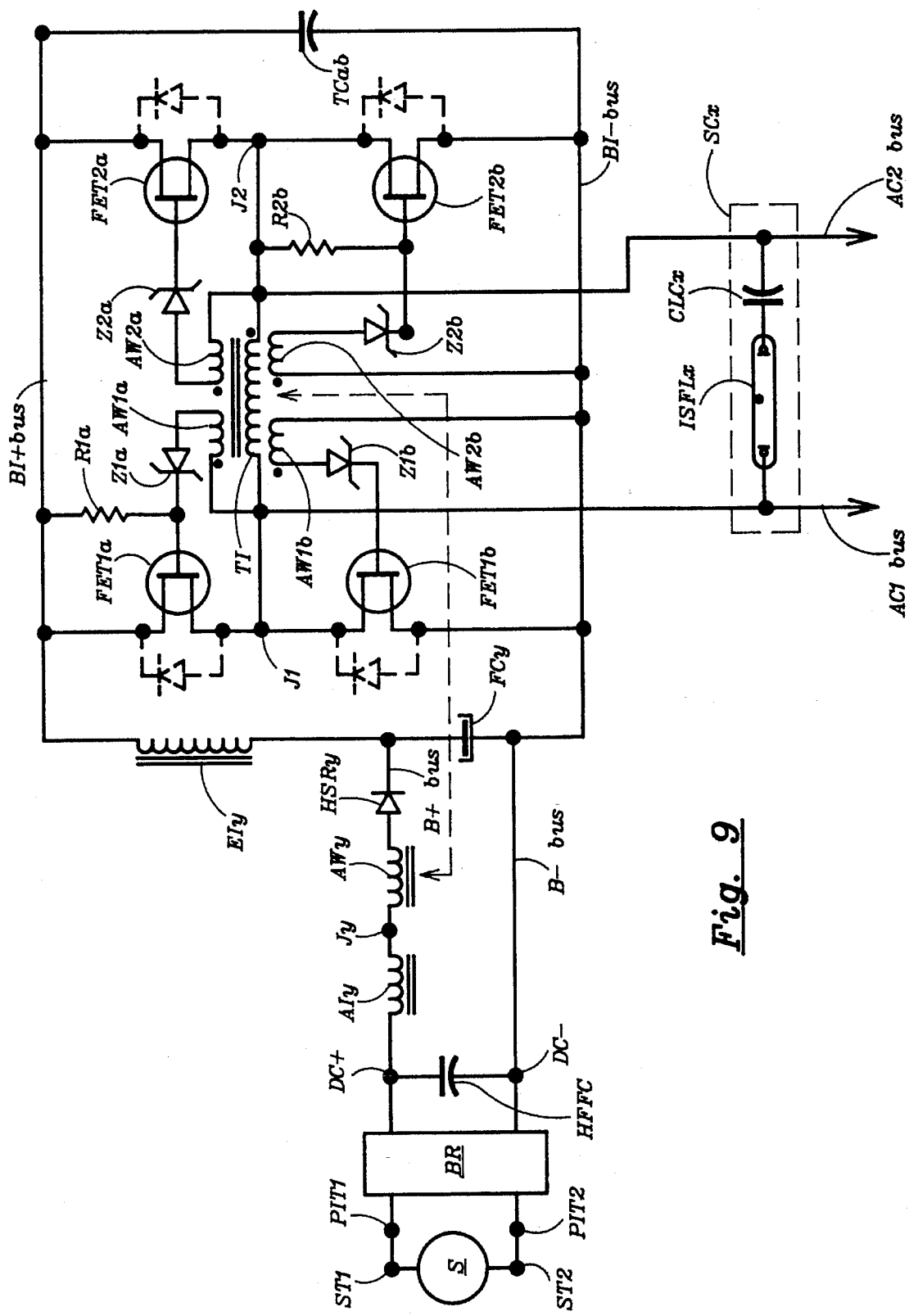
FIG. 9 schematically illustrates a second version of the fourth embodiment.

FIG. 9 is a schematic diagram of a second version of fourth and preferred embodiment of the present invention.

In FIG. 9, power line source S, power input terminals PIT1 & PIT2, bridge rectifier BR, high-frequency filtering capacitor HFFC, and terminals DC− & DC+ directly correspond to those of the arrangement of FIG. 5. Also, with the exception that an auxiliary winding AWy has been substituted for auxiliary winding AWc, all the elements connected between the BI− bus and the BI+ bus correspond directly to those similarly connected in the arrangement of FIG. 5.

Otherwise, in the arrangement of FIG. 9: an auxiliary inductor AIy is connected between the DC+ terminal and a junction Jy; and auxiliary winding AWy is connected between junction Jy and the anode of a high speed rectifier HSRy, whose cathode is connected with a B+ bus. An energy-storing inductor EIy is connected between the B+ bus and the BI+ bus. A filter capacitor FCy is connected between the B+ bus and a B− bus; which B− bus is directly connected with the BI− bus as well as with the DC− terminal.

Figure 11:
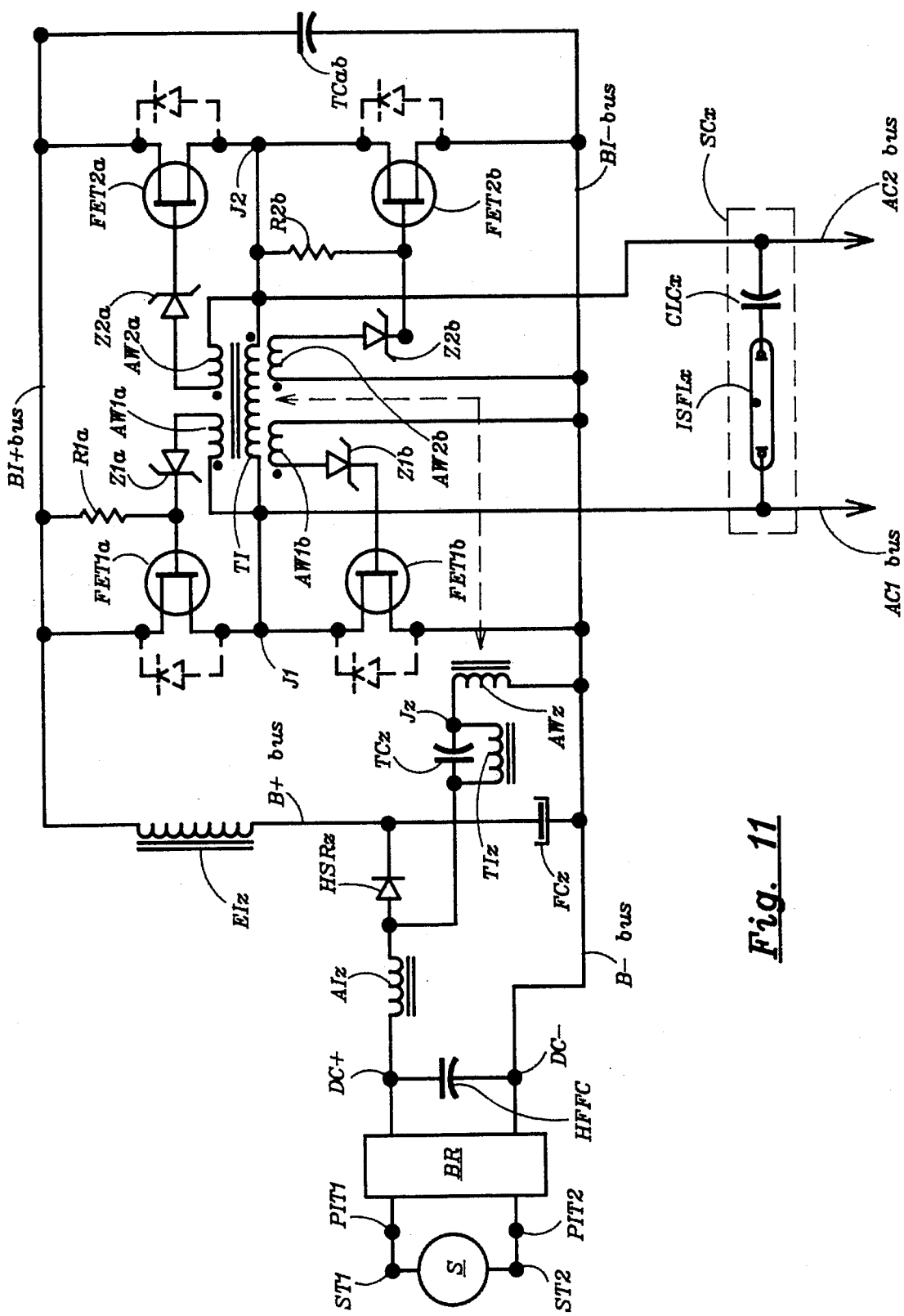
FIG. 11 schematically illustrates a third version of the fourth embodiment.

FIG. 11 is a schematic diagram of a third version of the fourth and preferred embodiment of the present invention.

In FIG. 11, power line source S, power input terminals PIT1 & PIT2, bridge rectifier BR, high-frequency filtering capacitor HFFC, and terminals DC− & DC+ directly correspond to those of the arrangement of FIG. 5. Also, except that an auxiliary winding AWz has replaced auxiliary winding AWc, all the elements connected between the BI− bus and the BI+ bus correspond directly to those similarly connected in the arrangement of FIG. 5.

Auxiliary winding AWz is connected between a B− bus and a junction Jz. A tuning capacitor TCz and a tuning inductor TIz are both connected between junction Jz and the anode of a high speed rectifier HSRz.

Otherwise, in the arrangement of FIG. 11, an auxiliary inductor AIz is connected between the DC+ terminal and the anode of high speed rectifier HSRz, whose cathode is connected with a B+ bus. An energy-storing inductor EIz is connected between the B+ bus and the BI+ bus. A filter capacitor FCz is connected between the B+ bus and the B− bus; which B− bus is directly connected with the BI− bus as well as with the DC− terminal.

Details of Operation of Fourth Embodiment

Figure 8:
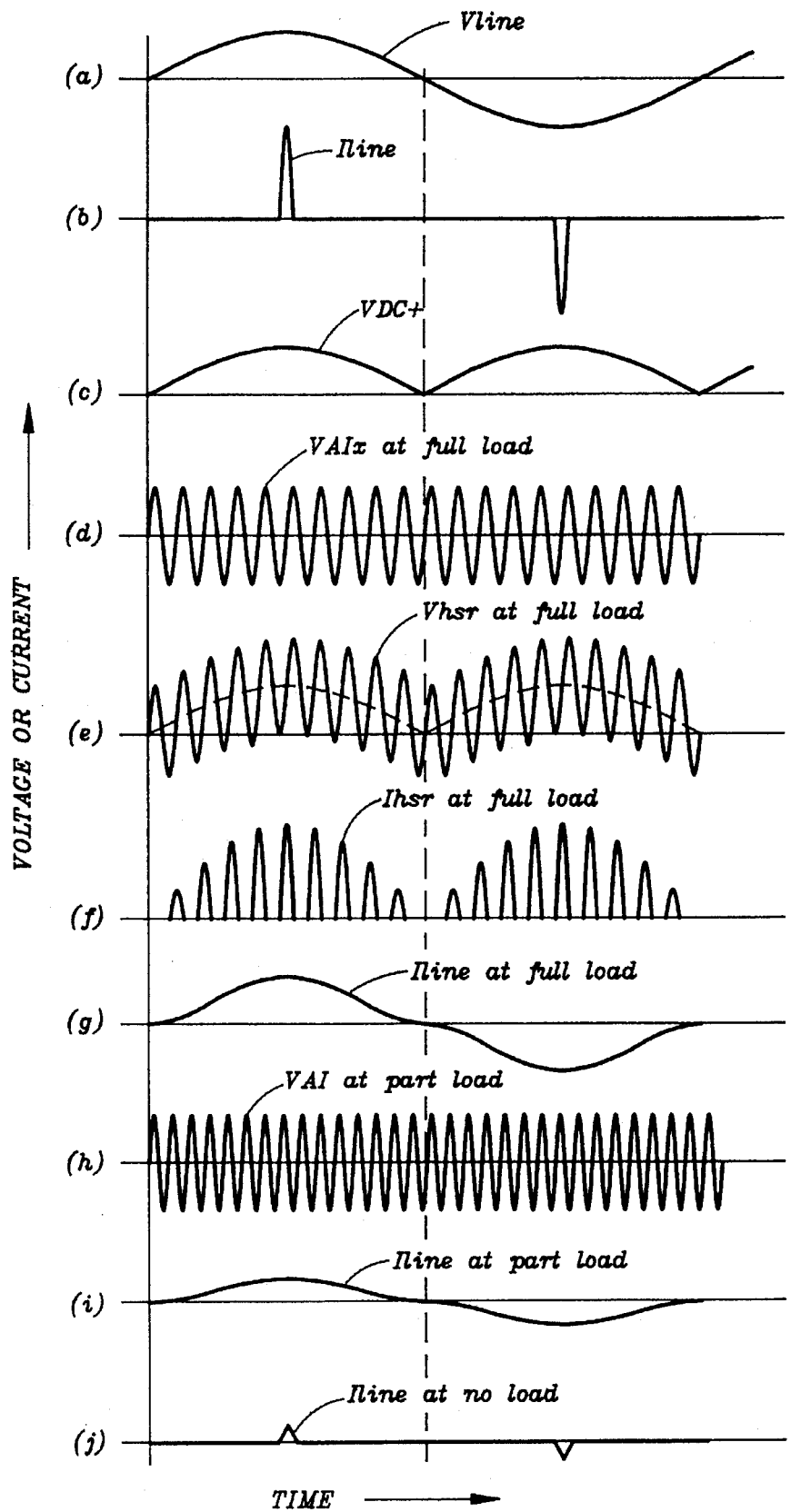
FIG. 8 shows various voltage and current waveforms associated with the embodiment of FIG. 7.
Figure 10:
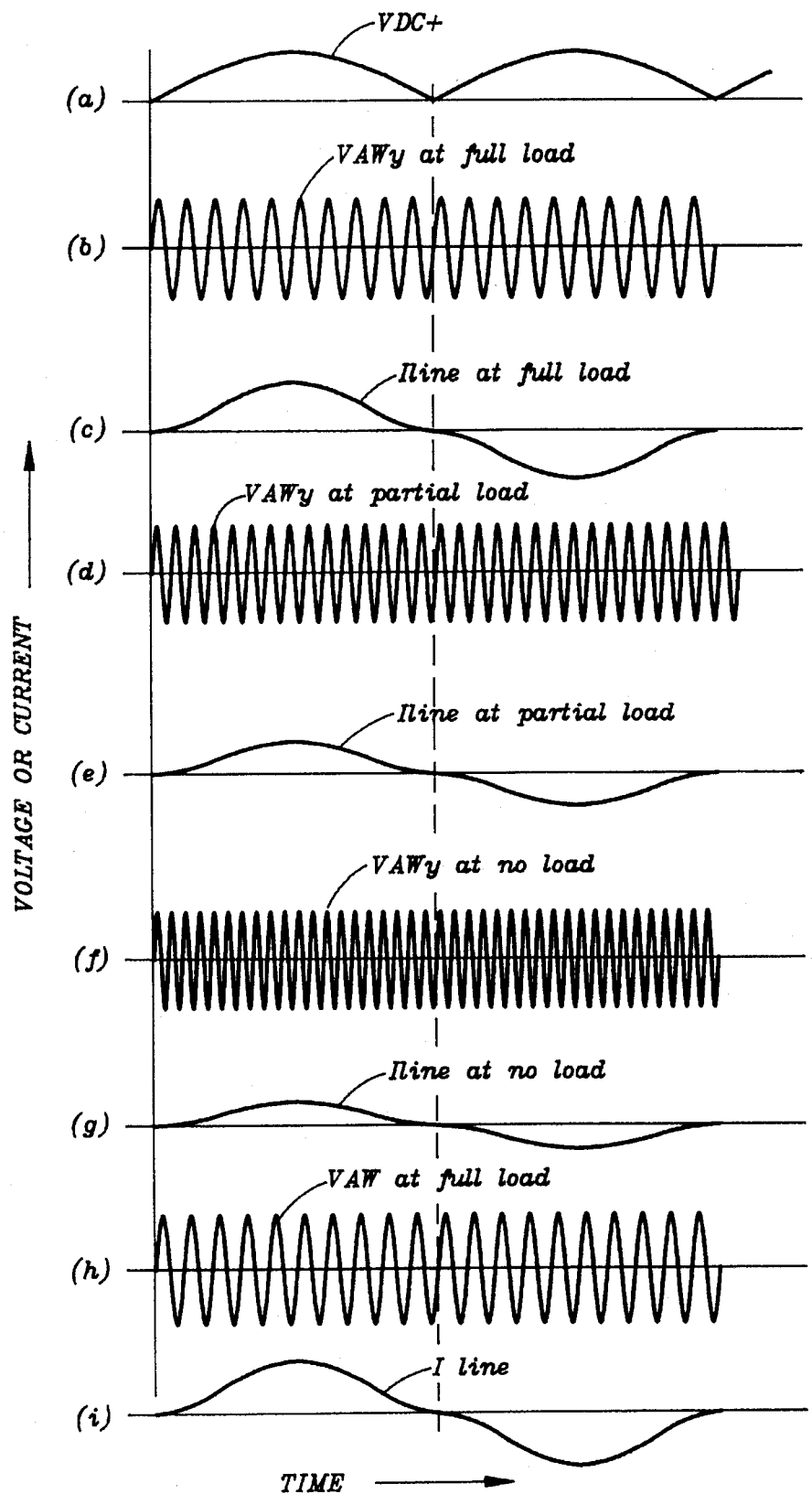
FIG. 10 shows various voltage and current waveforms associated with the embodiment of FIG. 9.
Figure 12:
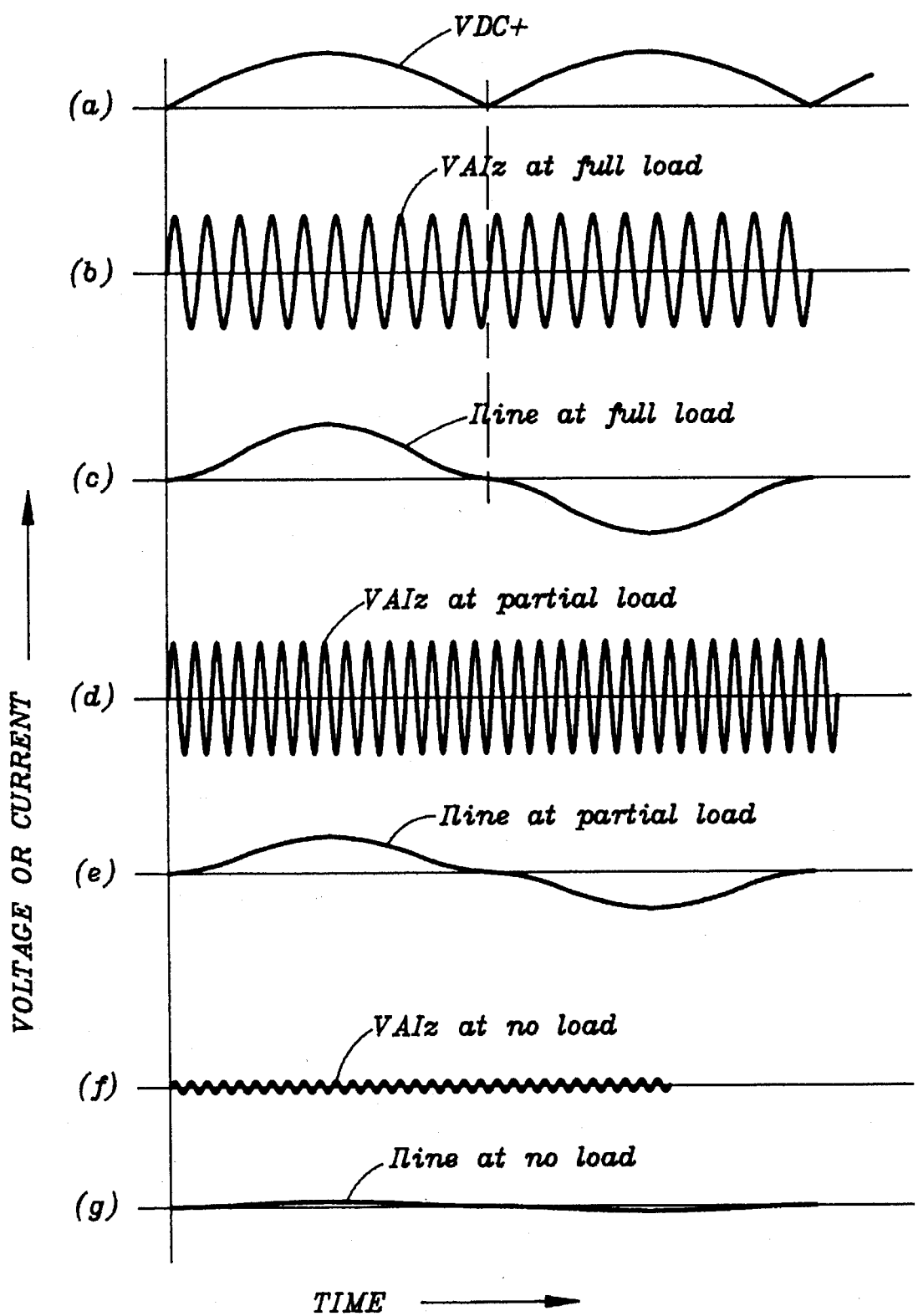
FIG. 12 shows various voltage and current waveforms associated with the embodiment of FIG. 9.

FIGS. 8, 10, 12 depict various voltage and current waveforms asociated with the first, second, and third versions of the fourth embodiment, all respectively.

In FIG. 8:

Waveform (a) represents the waveform and magnitude of the 60 Hz AC power line voltage provided across terminals PIT1/PIT2;

Waveform (b) represents the waveform of the line current drawn from the power line by the arrangement of FIG. 7 in a situation where the effect of auxiliary winding AWx (i.e., the effect of the power-factor-correcting function of the fourth embodiment) is disregarded (i.e., as if winding AWx had been physically removed from auxiliary inductor AIx);

Waveform (c) represents the waveform and magnitude of the unfiltered full-wave-rectified power line voltage, which is present at the DC+ terminal when measured from (or referenced to) the DC− terminal (or the B− bus);

Waveform (d) represents {under a condition of full load (e.g., with two lamps parallel-connected across the AC rails)} the waveform and magnitude of the high-frequency (e.g., 30 kHz at full load) voltage established across auxiliary inductor AIx due to the input provided thereto by auxiliary winding AWx;

Waveform (e) represents the waveform of the combination voltage presented at the anode of high speed rectifier HSRx under condition of full load and as measured from (or referenced to) the B− bus; which combination voltage is the sum of the voltages whose waveforms are depicted as Waveforms (c) and (d);

Waveform (f) represents the waveform of the unidirectional current pulses flowing through high speed rectifier HSRx under full load condition;

Waveform (g) represents the waveform of the line current drawn from the power line under full load condition;

Waveform (h) represents {under a condition of part load (e.g., with but a single lamp connected across the AC rails)} the waveform and magnitude of the high-frequency (e.g., 36 kHz at part load) voltage established across auxiliary inductor AIx by virctue of the input provided thereto by auxiliary winding AWx;

Waveform (i) represents the waveform and magnitude of the line current drawn from the power line under part load condition; and Waveform (j) represents the waveform and magnitude of the line current drawn from the power line under a condition of no load (i.e., without any lamps connected across the AC rails).

In FIG. 10:

Waveform (a) represents the waveform and magnitude of the unfiltered full-wave-rectified power line voltage, which is present at the DC+ terminal when referenced to the B− bus;

Waveform (b) represents {under a condition of full load} the waveform and magnitude of the high-frequency (e.g., 30 kHz) voltage provided across auxiliary winding AWy;

{Thus, as shown by Waveform (e) of FIG. 8, the combination voltage present at the anode of high speed rectifier HSRy is the sum of the voltages represented by Waveforms (a) and (b).}

Waveform (c) represents the waveform and the magnitude of the line current drawn from the power line under full load condition;

Waveform (d) represents {under a condition of part load} the waveform and magnitude of the high-frequency (e.g., 36 kHz) voltage provided across auxiliary winding AWy;

Waveform (e) represents the waveform and the magnitude of the line current drawn from the power line under part load condition;

Waveform (f) represents {under a condition of no load} the waveform and magnitude of the high-frequency (e.g., 55 kHz) voltage provided across auxiliary winding AWy;

Waveform (g) represents the waveform and the magnitude of the line current drawn from the power line under zero load condition;

Waveform (h) represents the waveform and magnitude of the high-frequency voltage provided across auxiliary winding AWy at full load and under a condition where the magnitude of the DC voltage present between the B− bus and the B+ bus is substantially higher than the peak magnitude of the power line voltage; and Waveform (i) represents the waveform and the magnitude of the line current drawn from the power line under the conditions associated with Waveform (h).

In FIG. 12:

Waveform (a) represents the waveform and magnitude of the unfiltered full-wave-rectified power line voltage, which is present at the DC+ terminal when referenced to the B− bus;

Waveform (b) represents {under a condition of full load} the waveform and magnitude of the high-frequency (e.g., 30 kHz) voltage provided across auxiliary inductor AIz as a result of the high-frequency (30 kHz) current injected thereinto from auxiliary winding AWz by way of the parallel-tuned circuit consisting of capacitor TCz and inductor TIz (which parallel-tuned circuit has a natural resonance at or near 60 kHz);

Waveform (c) represents the waveform and the magnitude of the line current drawn from the power line under full load condition;

Waveform (d) represents {under a condition of part load} the waveform and magnitude of the high-frequency (e.g., 36 kHz) voltage generated across auxiliary inductor AIz as a result of the high-frequency (36 kHz) current injected thereinto from auxiliary winding AWz;

Waveform (e) represents the waveform and the magnitude of the line current drawn from the power line under part load condition;

Waveform (f) represents {under a condition of no load} the waveform and magnitude of the high-frequency (e.g., 55 kHz) voltage developed across of auxiliary inductor AIz as a result of the high-frequency (55 kHz) current injected thereinto from auxiliary winding AWz; and Waveform (g) represents the waveform and the magnitude of the line current drawn from the power line under zero load condition.

With reference to the waveforms of FIG. 8, the operation of the first version of the fourth embodiment—which first version is schematically illustrated by FIG. 7—may be explained as follows.

In FIG. 7, whatever high-frequency auxiliary (or "pumping") voltage is established across auxiliary inductor AIx {refer to Waveform (d) of FIG. 8} will add to the 120 Hz sinusoidally-shaped unidirectional voltage pulses provided between the DC−/DC+ terminals {refer to Waveform (c) of FIG. 8}; and the sum of those two voltages {see Waveform (e) of FIG. 8} will be provided between the B− bus and the anode of high speed rectifier HSRx, whose cathode is connected with the B+ bus. With the magnitude of the DC voltage present between the B− bus and the B+ bus equal to the peak magnitude of the 120 Hz unidirectional voltage pulses, the amount of current pumped into the B+ bus via high speed rectifier HSRx will depend on the inductance of auxiliary inductor AIx as well as on the frequency and magnitude of the high-frequency pumping voltage.

With the peak magnitude of the high-frequency pumping voltage arranged to be equal to the peak magnitude of the unidirectional voltage pulses, as is indeed herein arranged for, the amount of current pumped into into the B+ bus will depend only on the frequency of the pumping voltage and the inductance of auxiliary inductor AIx.

Thus, with auxiliary inductor AIx being a given linear inductor, the magnitude of the current pumped into the B+ bus will depend solely on the frequency of the pumping voltage.

That is, with inductor AIx having a given linear inductance: (i) with an infinitely high pumping frequency, the magnitude of the current pumped into the B+ bus will be zero; (ii) with a high pumping frequency, the magnitude of the current pumped into the B+ bus will be low; (iii) with a low pumping frequency, the magnitude of the current pumped into the B+ bus will be high; etc.

Now, if more current is pumped into the B+ bus than is drained away therefrom (by whatever load is connected therewith), the magnitue of the DC voltage at the B+ bus (the "B+ voltage") will increase. If less current is pumped into the B+ bus than is drained away therefrom, the magnitude of the B+ voltage will decrease. However, the magnitude of the B+ voltage can not decrease below the peak magnitude of the 120 Hz unididirectional voltage pulses; otherwise, current would flow directly into the B+ bus without requiring the high-frequency pumping action.

In the arrangement of FIG. 7, to understand how to set up the power-factor-correcting pre-converter circuit {which consists of rectifier BR, capacitor HFFC, inductor AIx (with auxiliary winding AWx), rectifier HSRx and electrolytic capacitor FCx} it is instructive first to consider the arrangement of FIG. 9.

In the arrangement of FIG. 9, the pre-converter circuit is set up as follows.

First, for a given magnitude of the inverter's DC supply voltage (i.e., the B+ voltage, which is the voltage on the B+ bus as referenced to the B− bus), the number of turns on auxiliary winding AWy is so chosen as to provide across auxiliary winding AWy a high-frequency (30 kHz) voltage of RMS magnitude about equal to that of the unidirectional voltage pulses existing across terminals DC−/DC+.

Second, at full load {e.g., two fluorescent lamps, each connected across the AC rails by way of a current-limiting capacitor (e.g., CLCx)}, the inductance of auxiliary inductor AIy is chosen such as to provide for the most attractive (i.e., minimum harmonic distortion) waveform of the line current drawn from the power line while at the same time not permitting the magnitude of the DC supply voltage to be more than at most a few (e.g., five) percentage points higher than the peak magnitude of the power line voltage.

When so setting up the pre-converter of FIG. 9, the waveform of the line current drawn from the power line comes fairly close to being sinusoidal—with a total harmonic distortion not more than 15% or so. At the expense of somewhat reduced efficiency, the waveform of the line current may be improved (to under 10% harmonic distortion) by setting up the pre-converter such as to result in a B+ voltage of magnitude significantly higher than the peak of the power line voltage.

In the arrangement of FIG. 7, again taking full load to be two lamps, the inductance of auxiliary inductor AIx should be the same as that found above for auxiliary inductor AIy. Then, to establish the proper voltage across inductor AIx by feeding the load current through auxiliary winding AWx, the proper turns-ratio has to be established; which turns-ratio may be calculated by first measuring the magnitude of the full two-lamp load current, and then by calculating the RMS magnitude of the 30 kHz current required to be fed through inductor AIx to establish thereacross a 30 kHz voltage of RMS magnitude about equal to that of the voltage pulses across the DC−/DC+ terminals. Then, the required turns-ratio will be the ratio between the RMS magnitude of the load current and the calculated RMS magnitude of the 30 kHz current required through auxiliary inductor AIx.

Once set up under condition of a two-lamp load, if one lamp were to be removed, the operating frequency would change from 30 kHz to 36 kHz; which would result in the magnitude of the lamp current through the remaining one lamp increasing by that same ratio. As a result, the RMS magnitude of the (now) 36 kHz voltage across auxiliary inductor AIx decreases, but not by a factor of two (which would have been the case if frequency remained the same while total load current dropped by a factor of two). Instead, it decreases by a factor of about 1.39—which is 2.0 divided by the square of the ratio of 36 to 30. In other words, at reduced load (i.e., one-lamp load), the waveshape of the line current will not be as good as is at the full two-lamp load; but, with total harmonics of about 25%, it is still better than it would have been without any pre-conditioning.

Of course, at no load, there will be no pre-conditionig of the line current waveform. However, in most applications, that fact is of no consequence.

Additional comments re Fourth Embodiment (bd) With respect to the arrangement of FIG. 9, at full two-lamp load the operating result is essentially identical to that of the arrangement of FIG. 7. However, at reduced load, the pre-conditioning circuit causes more current to be pumped to the B+ bus than is being drained therefrom. As a result, the magnitude of the B+ voltage increases to the point where a balance is established; which is to say, to a point where the magnitude of current pumped to the B+ bus equals the magnitude of the current drained from the B+ bus. At about half of full load, this will occur at a point where the magnitude of the B+ voltage has increased by a significant degree, such as by 100% or so.

Of course, at no load, the magnitude of the B+ voltage will increase to a still higher degree: usually to a point of circuit self-destruction.

To overcome this obvious disadvantage, by way of a switch means such as indicated below, operation of the pre-conditioner circuit (i.e., the circuit consisting of rectifier BR, capacitor HFFC, inductor AIy, winding AWy, rectifier HSRy and capacitor FCy) may be interrupted whenever the magnitude of the B+ voltage exceeds some pre-established level (e.g., 20% above the peak magnitude of the power line voltage), and then be re-started as soon as the magnitude of the B+ voltage diminishes to a level only 5% higher than the peak magnitude of the power line voltage.

In FIG. 9, one simple way of interrupting the operation of the pre-conditioner as a result of an excess B+ voltage is that of placing a transistor in series with rectifier HSRy; and then arrange to have this transistor stay in its fully conducting state except whenever the magnitude of the B+ voltage exceeds a pre-determined level.

Of course, as will readily be appreciated by a person possessing ordinary skill in the art, the switching-ON and switching-OFF of this transistor must be effectuated by way of a bi-stable circuit; which bi-stable circuit must be responsive to the level of the magnitude of the B+ voltage. Of course, power to operate this bi-stable circuit may be attained by yet an additional auxiliary winding on tank inductor TI.

By setting-up the arrangement of FIG. 9 such as to draw continuous line current at full load (i.e., without causing the pre-conditioning function to be switched in and out), at any load substantially lower than full load, such switching-in and switching-out will take place, thereby causing power line current to be drawn in a periodically interrupted manner—with the duration of each period during which line current is being drawn being substantially longer than the duration of a complete cycle of the (60 Hz) power line voltage. However, when in fact being drawn, the total harmonic content of the line current will be low (e.g., under 10%).

(be) In a lighting system using a substantial number of ballasts of the type illustrated by the arrangement of FIG. 9, each individual ballast may in fact be set up (even at full load) to draw nearly sinusoidal line current in the periodically interrupted manner described in paragraph (bd) above, thereby giving rise to a situation where each individual ballast may exhibit a relatively low power factor when considered by itself alone. However, by arranging for the line current drawn by each of the various ballasts to be interrupted in a random manner (which, absent express arrangements for effectuating the interruptions in a contrary manner, will naturally result), the total line current drawn by all the ballasts will exhibit an aggregate power factor that is much improved over the power factor of each individual ballast. Similarly, the total line current will have an aggregate percentage harmonic content that is far lower than that of each individual ballast. In fact, with a relatively large number of ballasts connected to a given power circuit, the percentage harmonic content of the aggregate current will approach that of the current drawn by each individual ballast during the period when its pre-conditioner is activated.

(bf) In the arrangement of FIG. 11, high-frequency current for auxiliary inductor AIz is provided from auxiliary winding AWz on tank inductor TI by way of a frequency-dependent impedance means consisting of tank-capacitor TCz parallel-connected with tank-inductor TIz.

This parallel-connected L-C circuit is arranged to have a natural parallel-resonance at or near the operating frequency of the unloaded inverter (e.g., 55 kHz); which means that little or no high-frequency current will be provided to auxiliary inductor AIz under a condition of no load; which, in turn, means that the magnitude of the B+ voltage will not rise above the peak magnitude of the power line voltage to any detrimental degree.

Under a condition of full load (e.g., with two lamps connected between the AC rails), the inverter's operating frequency is lower (e.g., 30 kHz); and the parallel-connected L-C circuit is, at that lower frequency, arranged to have an impedance (i.e., a net inductive reactance) such as to cause the high-frequency current then supplied to auxiliary inductor AIz to be of magnitude just sufficient to cause the current drawn from the power line to have a nearly sinusoidal waveform while at the same time not causing the magnitude of the B+ voltage to exceed the peak magnitude of the power line voltage to any detrimental degree.

Under a condition of partial load (e.g., with only one lamp connected between the AC rails) , the inverter's operating frequency assumes an in-between value (e.g., 36 kHz); and the parallel-connected L-C circuit assumes an in-between degree of (inductively reactive) impedance, thereby to cause the high-frequency current delivered to auxiliary inductor AIz to assume an in-between and approximately appropriate magnitude, thereby to cause current to be drawn from the power line with a nearly sinusoidal waveform yet without cusing the magnitude of the B+ voltage to exceed the peak magnitude of the power line voltage to any detrimental degree.

(bg) With respect to the arrangement of FIG. 11, a particularly attractive modification is that of:

(i) removing inductor TIz; (ii) selecting the capacitance of capacitor TCz so as to provide high-frequency current to auxiliary inductor AIz of sufficient magnitude to cause, under maximum loading of the inverter, the magnitude of the B+ voltage to reach a level somewhat higher than the peak magnitude of the power line voltage, thereby to cause the current drawn from the power line to have a substantially sinusoidal magnitude; (iii) interposing a field-effect transistor between the negative output terminal of bridge rectifier BR and the DC– terminal (i.e., by connecting its source with the negative output terminal and its drain with the DC– terminal); and (iv) providing control circuitry connected with the source and gate terminals of this field-effect transistor, thereby to cause this transistor to assume a fully conductive (i.e., "ON") state whenever the magnitude of the B+ voltage is lower than a first level (e.g., 200 Volt) and to assume a fully non-conductive (i.e., "OFF") state whenever the magnitude of the B+ voltage reaches a second level (e.g., 230 Volt), where the second level is higher than the first level by a substantive amount (e.g., at least 10%).

Of course, the above-indicated control circuitry should provide for bi-stable action: switching the transistor OFF only after the magnitude of the B+ voltage has reached said second level; and then switching it ON again only after the magnitude of the B+ voltage has decreased all the way to the first level.

In real life applications of an electronic ballast, full load represents the most common load condition. Thus, it is preferable that circuit components be selected such that, at full load, the magnitude of the B+ voltage stabilizes at a level between the first and the second level, thereby to attain low harmonics and a particularly high power factor at this most common condition of full load.

Then, under partial load, the magnitude of the B+ voltage is likely to increase as long as the above-identified field-effect transistor is in its ON-state; which means that, under conditions of being loaded at less than full load, this transistor will periodically alternate between being in its ON-state and being in its OFF-state; which, in turn, means that the current drawn from the power line will be drawn in bursts. However, when in fact being drawn, the current will be of nearly sinusoidal waveform.

Under partial load, to prevent the ON/OFF cycling of the field-effect transistor to occur too frequently, filter capacitor FCz may be made to have extra large capacitance. Such extra large capacitance will have the additional and/or alternative benefit of permitting a narrower gap between said first level and second level, thereby to improve (i.e., minimize) lamp current crest factor.

(bh) In a ballast based on the circuit of FIG. 11, a further improvement is that of placing an additional winding on auxiliary inductor AIz. This additional winding should: (i) be tightly coupled with inductor AIz; (ii) have the same number of turns as the winding of inductor AIz; and (iii) be connected between the DC+ terminal and the anode of an additional high speed rectifier, whose cathode should be connected with the B+ bus.

The winding direction of this additional winding shold be opposite that of the winding of inductor AIz.

The additional winding on inductor AIz would provide for push-pull pumping action with respect to pumping current from the DC+ terminal to the B+ bus.

(bi) By arranging for the ferrite core of inductor AIz to be saturable (i.e., for the magnetizing characteristics of the ferrite core of inductor AIz to be non-linear), the degree of pumping action can be made to vary in such manner as to provide for the waveshape of the current drawn from the power line to be even more closely sinusoidal.

(bj) An alternative way of supplying high-frequency current to inductor AIz is that supplying this current to an (isolated) auxiliary winding tightly coupled with inductor AIz. That way, any suitable degree of impedance matching can readily be accomplished.

For instance, with reference to FIG. 11, auxiliary winding AWz on tank inductor TI may consist of relatively few turns, and its higher-current lower-voltage output can now be connected with the (isolated) auxiliary winding (of relatively few turns) on inductor AIz by way of a capacitor series-connected with an auxiliary field-effect transistor arranged to switch between an ON-state and an OFF-state in a manner entirely corresponding to that of the field-effect transistor described in paragraph (bg) hereinabove.

Thus, by virtue of switching this this auxiliary field-effect transistor ON and OFF, the high-frequency pumping current is switched ON and OFF.

Of course, to permit such switching to take place, this auxiliary field-effect transistor should have a commutating diode connected between its source and drain terminals. However, since most currently available field-effect transistors integrally include such commutating diodes, there is actually no need to add an external diode to the auxiliary field-effect transistor.

(bk) In the arrangement described in paragraph (bj) above, an additional degree of control may be achieved by providing for the auxiliary field-effect transistor to be switched ON/OFF on a cycle-by-cycle basis, as referenced to the high-frequency current. That way, more accurate waveshaping of the current drawn from the power line can be effectuated. Moreover, accurate regulation of the magnitude of the B+ voltage may be attained without having to resort to the bang-bang-type control method described in paragraph (bd) hereinabove.

Beyond that, an even finer degree of control may be attained by using push-pull current-pumping between the DC+ terminal and the B+ bus, while at the same time using half-cycle-by-half-cycle control of the auxiliary field-effect transistor.

(bl) With respect to the fourth embodiment, such as exemplified by the arrangement of FIG. 9, power-factor-correction may be attained in a somewhat different way. In particular, instead of elements AIy, AWy & HSRy, the following two elements may be used: (i) on tank inductor TI, an auxiliary winding AWxx with a first and a second auxiliary output terminal; and (ii) a voltage-doubling-like rectifier-capacitor-combination VDRCxx.

VDRCxx, in turn, consists of: (i) a first and a second high-speed rectifier, the first connected with its cathode to the first auxiliary output terminal, the second connected with its anode to the first auxiliary output terminal; and (ii) a first and a second current-limiting capacitor, each having one of its terminals connected together as well as with the second auxiliary output terminal, the first current-limiting capacitor having its other terminal connected with the anode of the first high-speed rectifier, the second current-limiting capacitor having its other terminal connected with the cathode of the second high-speed rectifier.

Thus, in lieu of AIy, AWy & HSRy, VDRCxx is connected between the DC+ terminal and the B+ bus in such a manner that: (i) the cathode of the second high-speed rectifier is connected with the B+ bus; and (ii) the anode of the first high-speed rectifier is connected with the DC+ terminal.

As a result, a nearly sinusoidal current will be drawn from the power line provided: (i) the peak-to-peak magnitude of the high-frequency inverter voltage present across the terminals of auxiliary winding AWxx is about equal to that of the power line voltage; and (ii) the capacitance values of the two current-limiting capacitors are so chosen as to cause a just sufficient amount of current to be pumped from the DC+ terminal to the B+ bus to cause the magnitude of the B+ voltage to be just slightly (e.g., no more than about 10%) higher than the peak magnitude of the power line voltage.

(bm) The basic principle underlying the operation of the power-factor-correcting function of the fourth embodiment is that of using high-frequency voltage (or current) from the inverter for the additional function of providing a high-frequency pumping voltage in series with the output of the full-wave rectifier (as provided across the DC−/DC+ terminals of bridge rectifier BR), thereby to pump current from the DC+ terminal to the B+ bus such that, even when the instantaneous magnitude of the unidirectional voltage at the DC+ terminal is lower than that of the B+ bus, current will be drawn from the DC+ terminal and delivered to the B+ bus. The magnitude of the current so pumped will depend on the magnitude and the frequency of the high-frequency pumping voltage as well as on the effective reactance of whatever reactance means is used to limit the magnitude of the current resulting from the action of the high-frequency pumping voltage.

(bn) A characterizing feature of the power-factor-correcting function of the fourth embodiment, as implemented in accordance with one of the electronic ballasting arrangements shown in FIGS. 7, 9, 11, is that the waveform of the power line current will become decreasingly sinusoidal with decreasing magnitude of the power line voltage. Thus, if the circuit be designed to draw a power line current with 10% total harmonic distortion when powered with at a power line voltage of 120 Volt RMS, the total harmonic distortion will be distinctly higher than 10% when powered with 110 Volt RMS.

(bo) With reference to the circuit arrangement of FIG. 9, a way of achieving smooth and effective control of the magnitude of the A+ voltage (as well as of the waveform of the power line current) is that of placing a field effect transistor FETy in series with high-speed rectifier HSRy— with the field effect transistor's source terminal being connected with the B+ bus and its drain terminal connected with the cathode of HSRy.

Transistor FETy should then be controlled such as to cause it: (i) to switch OFF at some point when no current flows through it; and (ii) to switch ON at a point controlled by the magnitude of a control voltage.

Thus, by delaying the switch-ON of FETy to a point later than when current otherwise would have flown through it, the magnitude of the ensuing current pulse will be reduced— with this pulse-magnitude controllable over a wide range: from a maximum value determined in the manner described above (e.g., by the inductance of inductor AIy) all the way to zero.

In other words, by controlling the switch-ON points of FETy, the magnitude of the current delivered to the B+ bus can be accurately controlled, thereby to accurately control the magnitude of the A+ voltage as well as the detailed waveshape of the current drawn from the power line.

By controlling the switching ON and OFF of FETy as indicated above, particularly efficient switching results for the reason that FETy will always be switched at a time when no current is flowing; which is to say: no switching losses.

(bp) High-speed rectifier HSRy may be eliminated and replaced with a short circuit by: (i) placing capacitor HFFC between terminals PIT1/PIT2 instead of between terminals DC−/DC+; and (ii) using at least two high-speed rectifiers in bridge rectifier BR.

(bq) The term substantially sinusoidal waveform is herein defined as being a waveform having no more than about 10% total harmonic distortion.

The term nearly sinusoidal waveform is herein defined as being a waveform having no more than about 20% total harmonic distortion.

I claim:

1. An arrangement comprising:

a power line source operative to provide an AC power line voltage across a pair of power line terminals;

rectifying circuit connected with the power line terminals and operative to provide unfiltered full-wave-rectified AC power line voltage at a first pair of DC terminals;

inductor device having a set of inductor terminals;

auxiliary rectifier device having a set of auxiliary rectifier terminals;

filter capacitor connected between a second pair of DC terminals; a DC voltage of substantially constant magnitude existing between the second pair of DC terminals;

gas discharge lamp having a set of lamp terminals;

inverter-type ballasting circuit connected between the second pair of DC terminals and the lamp terminals, thereby to supply a high-frequency current thereto; the frequency of the high-frequency current being substantially higher than the frequency of the AC power line voltage; the inverter-type ballasting means being further characterized by including a pair of auxiliary inverter output terminals across which is provided a high-frequency voltage; and connection device operative to cause series-connection of: (i) the first pair of DC terminals; (ii) the inductor terminals; (iii) the auxiliary inverter output terminals; (iv) the auxiliary rectifier terminals; and (v) the second pair of DC terminals.

2. The arrangement of claim 1 wherein a capacitor is connected across the first pair of DC terminals.

3. The arrangement of claim 1 wherein the inductor device is further characterized as being an inductor with a pair of inductor terminals.

4. The arrangement of claim 1 wherein the rectifying circuit is further characterized by drawing from the power line terminals a line current with a waveform exhibiting no more than about twenty percent total harmonic distortion.

5. The arrangement of claim 1 wherein the rectifying circuit is further characterized by drawing from the power line terminals a current with a substantially sinusoidal waveform; a substantially sinusoidal waveform being defined as a waveform having less than ten percent total harmonic distortion.

6. An arrangement comprising:

a source providing an AC power line voltage at a pair of power line terminals;

full-wave rectifying device connected with the power line terminals and providing a pulsating DC voltage at a first pair of DC terminals; the instantaneous absolute magnitude of the pulsating DC voltage being approximately equal to that of the AC power line voltage;

conditioning circuit connected with the first pair of DC terminals, operative to draw a first pulsating unidirectional current therefrom, and to deliver a second pulsating unidirectional current to a second pair of DC terminals across which exists a nearly constant DC voltage; the nearly constant DC voltage having a magnitude that varies no more than about plus/minus twenty percent from a constant average value; the first pulsating unidirectional current having an absolute instantaneous magnitude approximately proportional to that of the AC power line voltage;

an inverter circuit connected with the second DC terminals and operative to provide an AC inverter voltage at a pair of inverter output terminals; the AC inverter voltage having an absolute magnitude that varies in exact synchronism with that of the second pulsating unidirectional current and at a frequency substantially higher than that of the absolute magnitude of the AC power line voltage; and a gas discharge lamp connected in circuit with the inverter output terminals.

7. The arrangement of claim 6 wherein the conditioning means is further characterized by including a pair of auxiliary terminals across which exists an auxiliary AC voltage of frequency equal to that of the AC inverter voltage; the auxiliary terminals being connected in circuit between the first DC terminals and the second DC terminals.

8. The arrangement of claim 7 wherein the auxiliary AC voltage is generated and delivered to the auxiliary terminals by the inverter circuit.

9. The arrangement of claim 6 wherein: (i) the AC power line voltage is substantially of sinusoidal waveform; and (ii) the first pulsating unidirectional current drawn from the first DC terminals gives rise to a line current being supplied from the power line terminals, the line current exhibiting no more than twenty percent total harmonic distortion.

10. The arrangement of claim 6 wherein: (i) the AC power line voltage is substantially of sinusoidal waveform; and (ii) the first pulsating unidirectional current drawn from the first DC terminals gives rise to a substantially sinusoidal line current being supplied from the power line terminals; a substantially sinusoidal current being defined as an alternating current having a waveform exhibiting less than about ten percent total harmonic distortion.

11. The arrangement of claim 6 wherein the conditioning circuit is further characterized by having a pair of auxiliary terminals between which flows an alternating current of frequency equal to that of the AC inverter voltage.

12. The arrangement of claim 11 wherein said alternating current exhibits a nearly sinusoidal waveform; a nearly sinusoidal waveform being defined as a waveform having no more than about twenty percent total harmonic distortion.

13. The arrangement of claim 6 wherein the conditioning circuit is further characterized by having a pair of auxiliary terminals across which exists an alternating voltage of frequency equal to that of the AC inverter voltage.

14. The arrangement of claim 13 wherein said alternating voltage exhibits a nearly sinusoidal waveform; a nearly sinusoidal waveform being defined as a waveform having no more than about twenty percent total harmonic distortion.

15. The arrangement of claim 6 wherein the inverter circuit includes an energy-storing inductor operative to cause any unidirectional current drawn by the inverter circuit from the second DC terminals to be of nearly constant magnitude; a nearly constant magnitude being defined as a magnitude varying no more than about plus/minus twenty percent from a constant average value.

16. The arrangement of claim 6 wherein the conditioning means is further characterized by including an auxiliary inductor through which flows the second pulsating unidirectional current.

17. The arrangement of claim 16 wherein the conditioning circuit is yet further characterized by including a high-speed rectifier series-connected with the auxiliary inductor; the second pulsating unidirectional current thereby flowing through both high-speed rectifier and the inductor.

18. An arrangement comprising:

a source providing an AC power line voltage at a pair of power line terminals;

full-wave rectifying device connected with the power line terminals and providing a pulsating DC voltage at a first pair of DC terminals; the instantaneous absolute magnitude of the pulsating DC voltage being approximately equal to that of the AC power line voltage;

conditioning circuit connected with the first pair of DC terminals and operative: (i) to draw a first pulsating unidirectional current therefrom, and (ii) to deliver from a second pair of DC terminals a second pulsating unidirectional current; the first pulsating unidirectional current causing a line current to be drawn from the power line terminals, the line current being characterized by having a nearly sinusoidal waveform, a nearly sinusoidal waveform being defined as a waveform exhibiting no more than about twenty percent total harmonic distortion; the conditioning means being further characterized by including: (i) an auxiliary inductor means so disposed as to have the second pulsating current flowing through it, (ii) a rectifier means so disposed as to have the second pulsating current flowing through it, and (iii) an energy-storing capacitor into which flows the second pulsating current and across which exists a nearly constant DC voltage, the nearly constant DC voltage having a magnitude that varies no more than about plus/minus twenty percent from a constant average value;

an inverter circuit connected with the second DC terminals and operative to provide an AC inverter voltage at a pair of inverter output terminals; the AC inverter voltage being of frequency higher than that of the AC power line voltage; and a gas discharge lamp connected in circuit with the inverter output terminals.

19. An arrangement comprising:

a source providing an AC power line voltage at a pair of power line terminals;

a first sub-circuit having a first pair of AC input terminals connected with the power line terminals; the first sub-circuit being operative to rectify the AC power line voltage, thereby to provide a pulsating DC voltage across a first pair of DC terminals; the pulsating DC voltage consisting of unidirectional voltage pulses having a repetition rate equal to twice the frequency of the AC power line voltage;

a second sub-circuit connected with the first pair of DC terminals and operative periodically to draw therefrom unidirectional current pulses and to deliver these periodic unidirectional current pulses to a second pair of DC terminals; the repetition-rate of the periodic unidirectional current pulses being higher than twice the frequency of the AC power line voltage; a unidirectional voltage being present across the second DC terminals, the unidirectional voltage having an instantaneous magnitude that varies no more than plus/minus twenty percent from a constant average value as averaged over a period equal to a whole number of complete cycles of the AC power line voltage; the unidirectional current pulses drawn from the first pair of DC terminals causing a line current to be drawn from the power line terminals; the line current being an alternating current with a waveform having no more than twenty percent total harmonic distortion; the second sub-circuit being further characterized by including an inverter sub-circuit connected with the second DC terminals and operative to provide an AC inverter voltage across a pair of inverter output terminals; and a third sub-circuit connected with the inverter output terminals; the third sub-circuit being characterized by including a gas discharge lamp.

20. The arrangement of claim 19 wherein the repetition rate of the periodic current pulses is equal to a whole multiple of the frequency of the AC inverter voltage.

21. The arrangement of claim 19 wherein the second sub-circuit is further characterized by including an auxiliary AC voltage source providing a periodic auxiliary AC voltage functional to cause electric charge to be pumped from the first DC terminals to the second DC terminals even at times when the instantaneous absolute magnitude of the pulsating DC voltage is lower than that of the unidirectional voltage.

\* \* \* \* \*